(12) United States Patent
Takeuchi

(10) Patent No.: US 10,396,081 B2
(45) Date of Patent: Aug. 27, 2019

(54) SEMICONDUCTOR DEVICE, ANTENNA SWITCH CIRCUIT, AND WIRELESS COMMUNICATION APPARATUS

(71) Applicant: Sony Corporation, Tokyo (JP)

(72) Inventor: Katsuhiko Takeuchi, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 15/519,979

(22) PCT Filed: Oct. 5, 2015

(86) PCT No.: PCT/JP2015/078169
§ 371 (c)(1),
(2) Date: Apr. 18, 2017

(87) PCT Pub. No.: WO2016/072188
PCT Pub. Date: May 12, 2016

(65) Prior Publication Data
US 2017/0330880 A1    Nov. 16, 2017

(30) Foreign Application Priority Data

Nov. 4, 2014    (JP) .................................. 2014-224156

(51) Int. Cl.
*H01L 27/098*    (2006.01)
*H01L 29/778*    (2006.01)
(Continued)

(52) U.S. Cl.
CPC .......... *H01L 27/098* (2013.01); *H01L 29/778* (2013.01); *H01L 29/808* (2013.01);
(Continued)

(58) Field of Classification Search
CPC ... H01L 27/098; H01L 29/778; H01L 29/808; H01L 29/812; H01L 27/085; H01L 29/7783; H01L 29/66462; H01L 29/201; H01L 29/205; H01L 21/02543; H01L 21/02546; H01L 21/0228; H01L 29/207;
(Continued)

(56) References Cited

U.S. PATENT DOCUMENTS 6,281,528 B1 *    8/2001    Wada ................... H01L 29/452
                                                                    257/192
2002/0003245 A1 *    1/2002    Kato ................. H01L 21/28587
                                                                    257/279
(Continued)

FOREIGN PATENT DOCUMENTS

JP    H-11-150264 A    6/1999

*Primary Examiner* — Shahed Ahmed
(74) *Attorney, Agent, or Firm* — Michael Best & Friedrich LLP

(57) ABSTRACT

A semiconductor device includes a layered body, a gate electrode, a source electrode, a drain electrode, and a cap layer. The layered body includes a channel layer and a first low resistance region. The channel layer is made of a compound semiconductor. The first low resistance region is provided in a portion on surface side of the layered body. The gate electrode, the source electrode, and the drain electrode are each provided on top surface side of the layered body. The cap layer is provided between the first low resistance region and one or both of the source electrode and the drain electrode.

14 Claims, 26 Drawing Sheets

(51) Int. Cl.
*H01L 29/808* (2006.01)
*H01L 29/812* (2006.01)
*H04B 1/44* (2006.01)
*H01L 27/085* (2006.01)

(52) U.S. Cl.
CPC ............ *H01L 29/812* (2013.01); *H04B 1/44* (2013.01); *H01L 27/085* (2013.01)

(58) Field of Classification Search
CPC .......... H01L 29/66431; H01L 29/7786; H01L 2924/13064; H04B 1/44
See application file for complete search history.

(56) References Cited

U.S. PATENT DOCUMENTS

| | | | |
|---|---|---|---|
| 2003/0132496 A1* | 7/2003 | Terano | H01L 29/475 257/449 |
| 2013/0228790 A1* | 9/2013 | Yamamura | H01L 29/2003 257/76 |
| 2015/0171171 A1* | 6/2015 | LaRoche | H01L 21/0254 257/615 |

* cited by examiner

[FIG. 1]
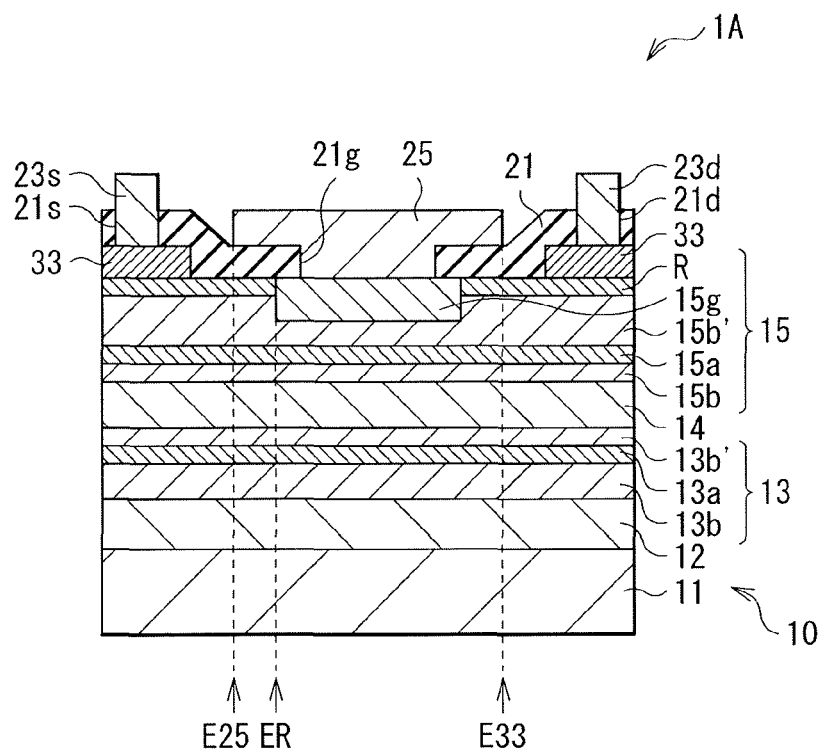

[FIG. 2]
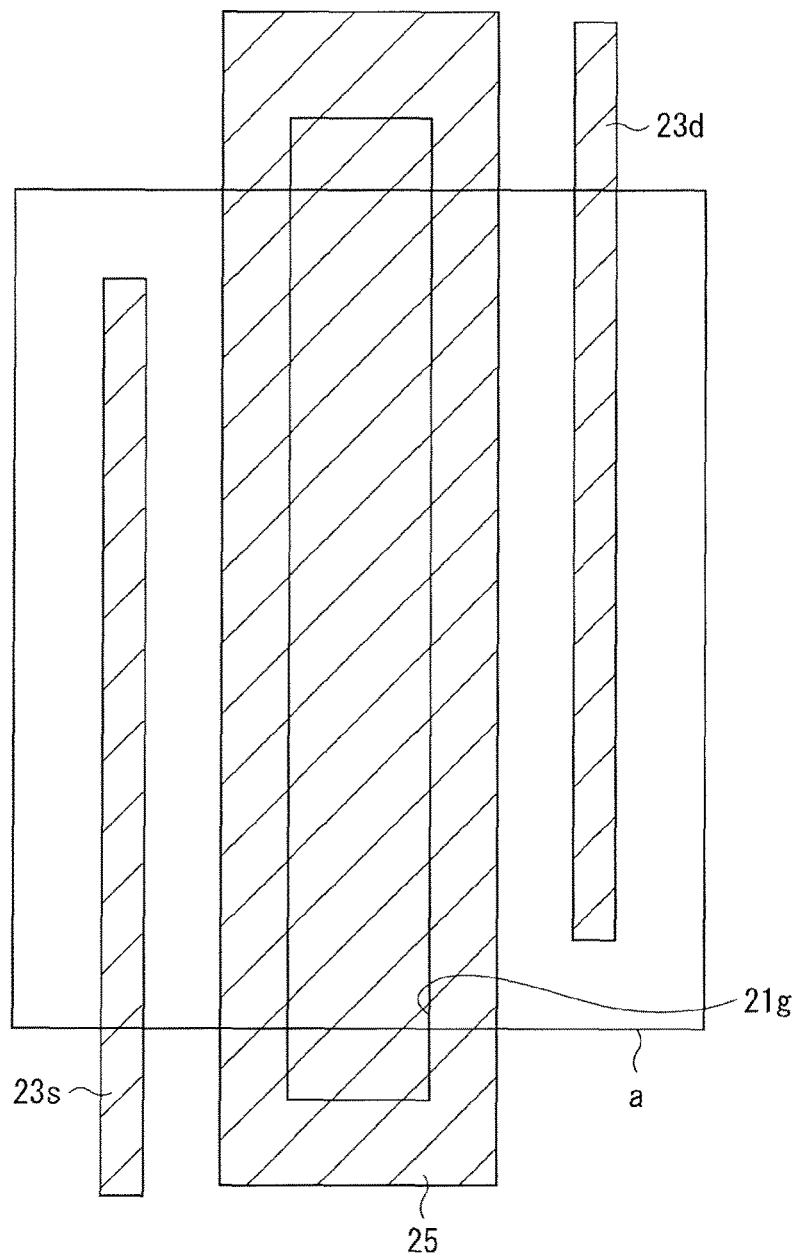

[ FIG. 3 ]
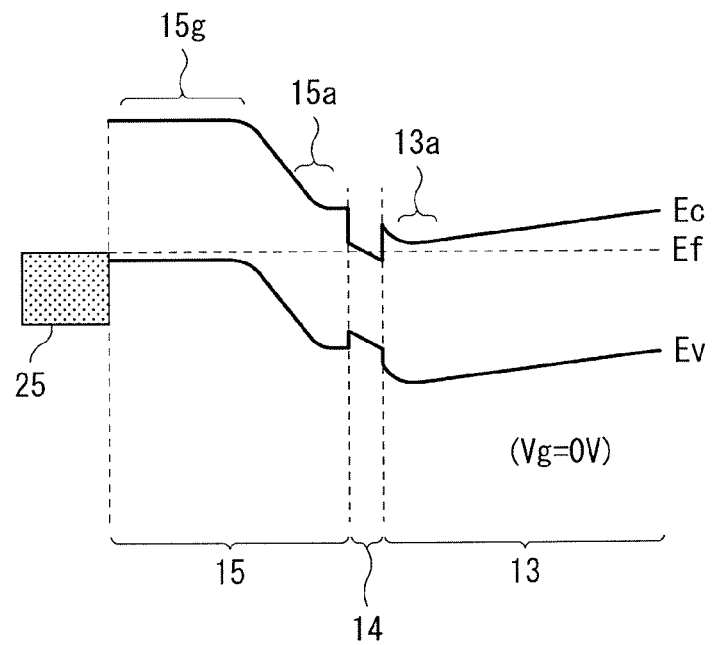
[ FIG. 4 ]
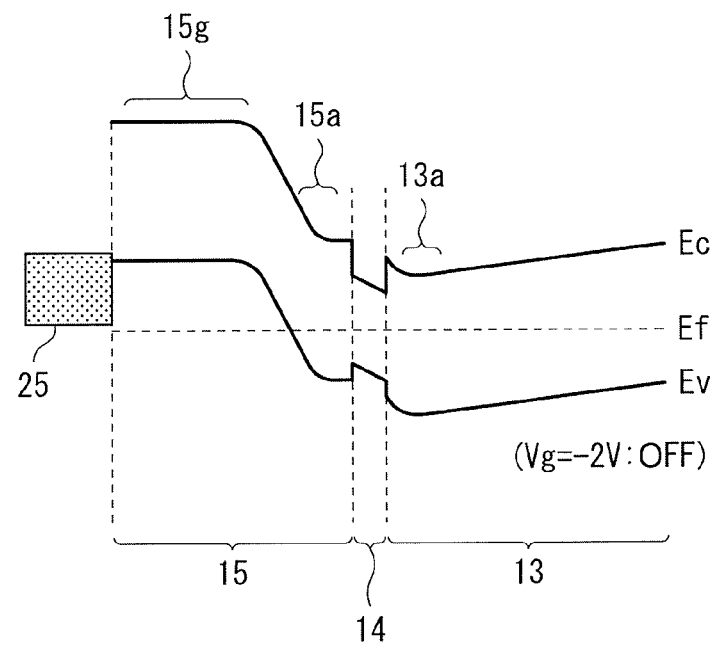

[ FIG. 5 ]
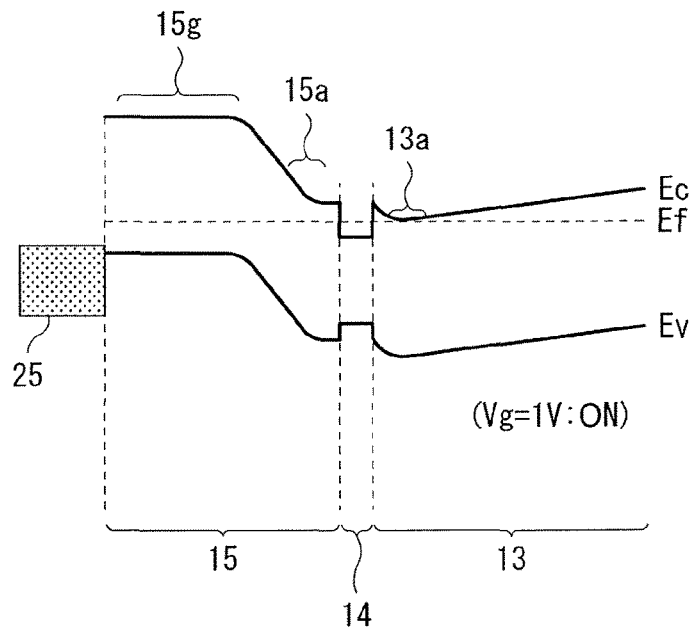
[ FIG. 6 ]
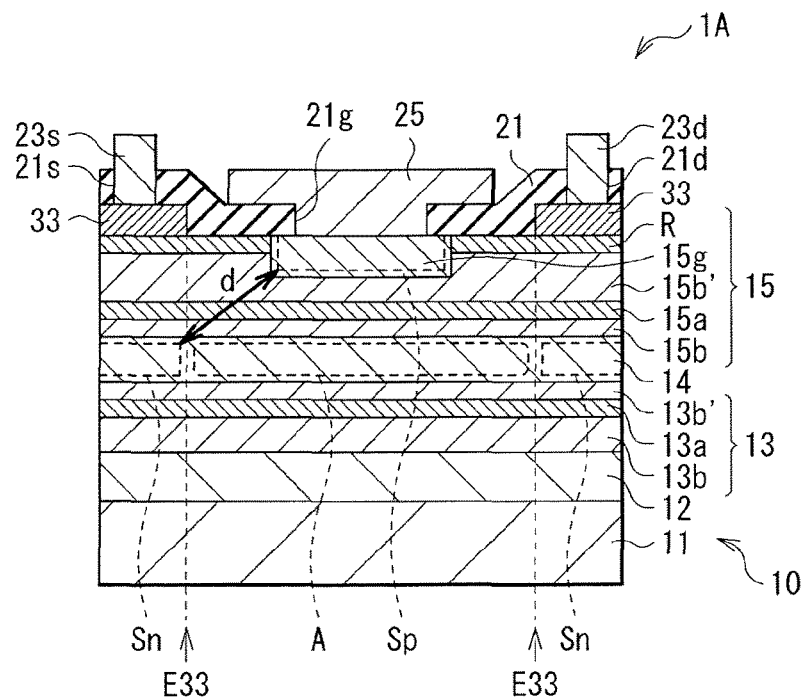

[ FIG. 7A ]
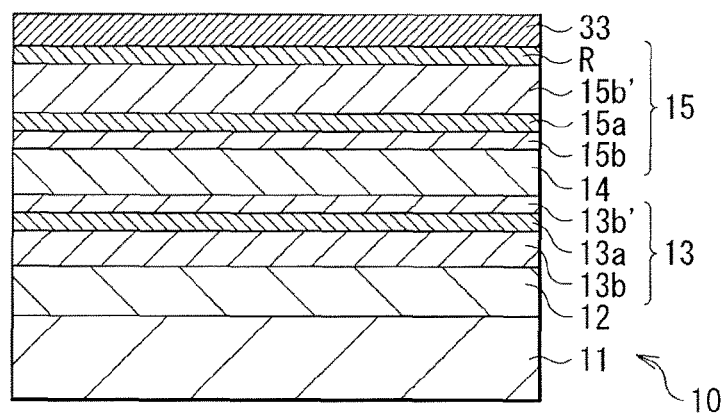
[ FIG. 7B ]
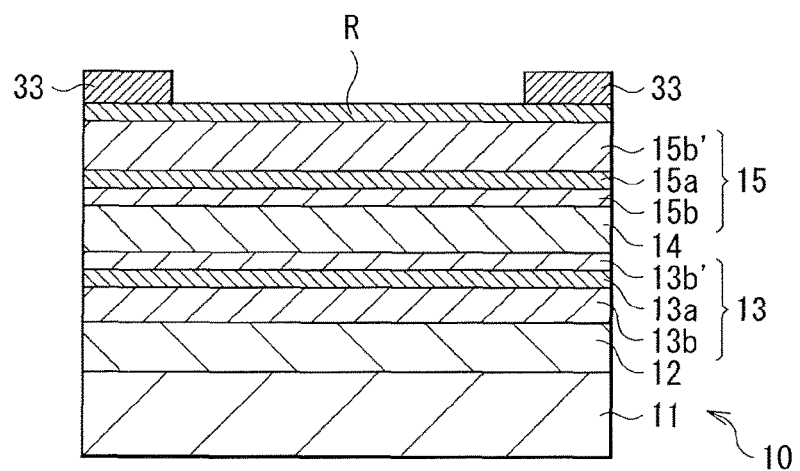

[ FIG. 7C ]
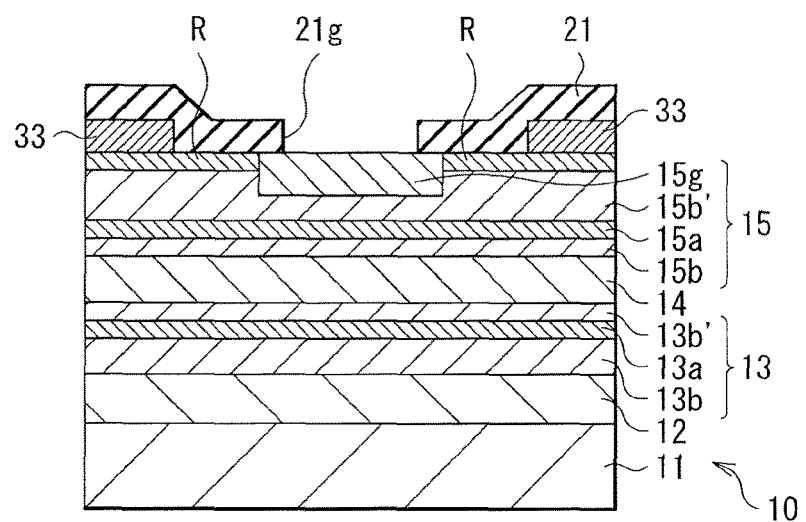
[ FIG. 7D ]
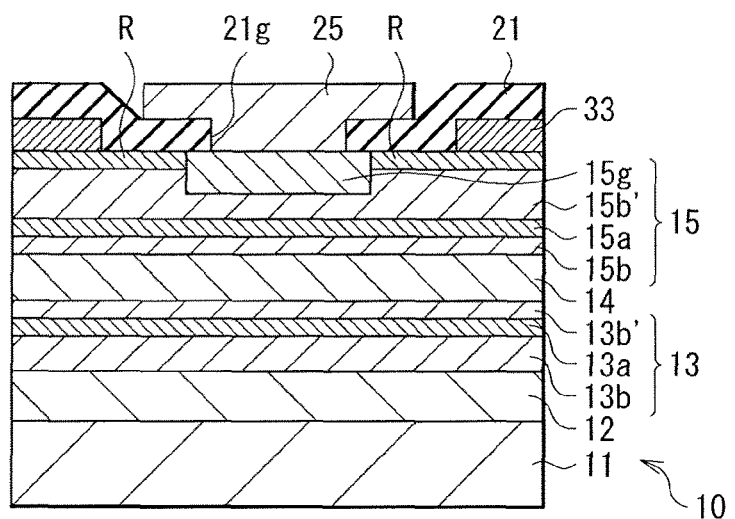

[ FIG. 8 ]
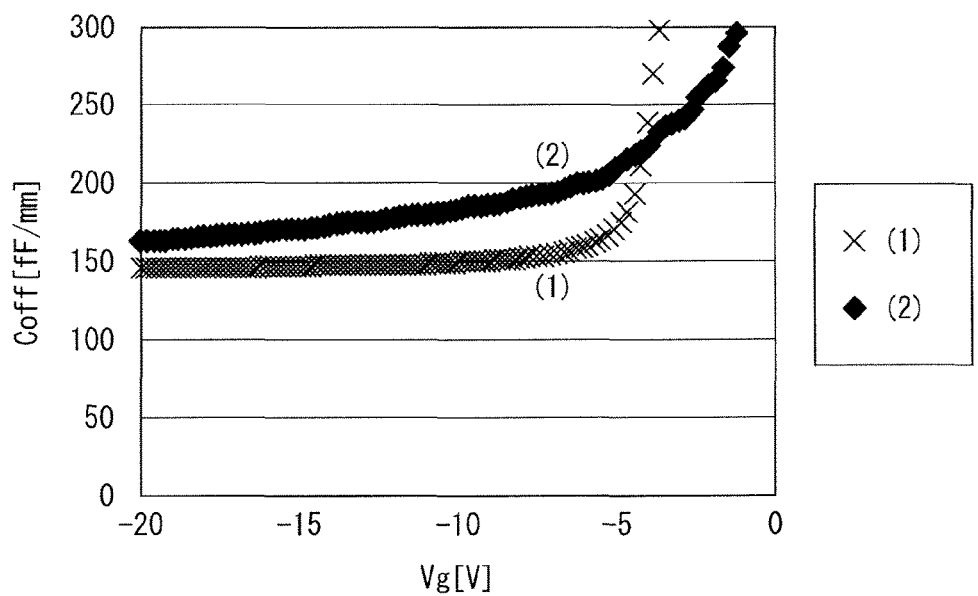
[ FIG. 9 ]
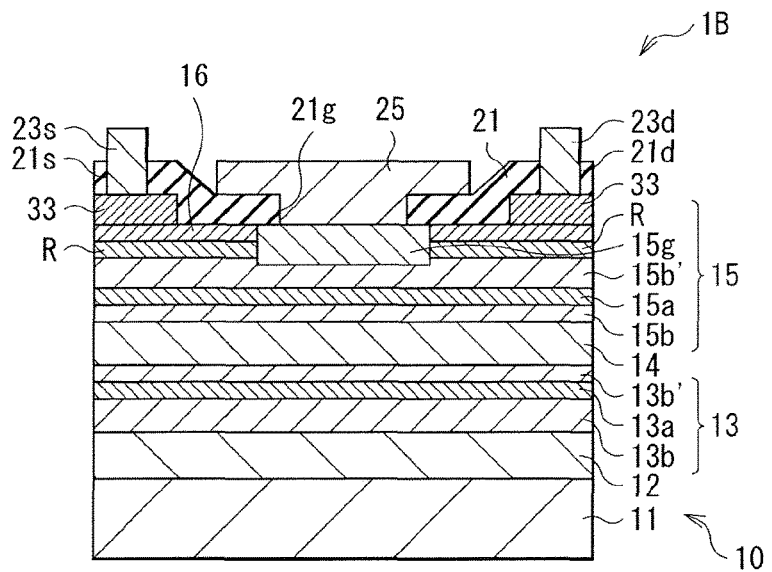

[ FIG. 10 ]
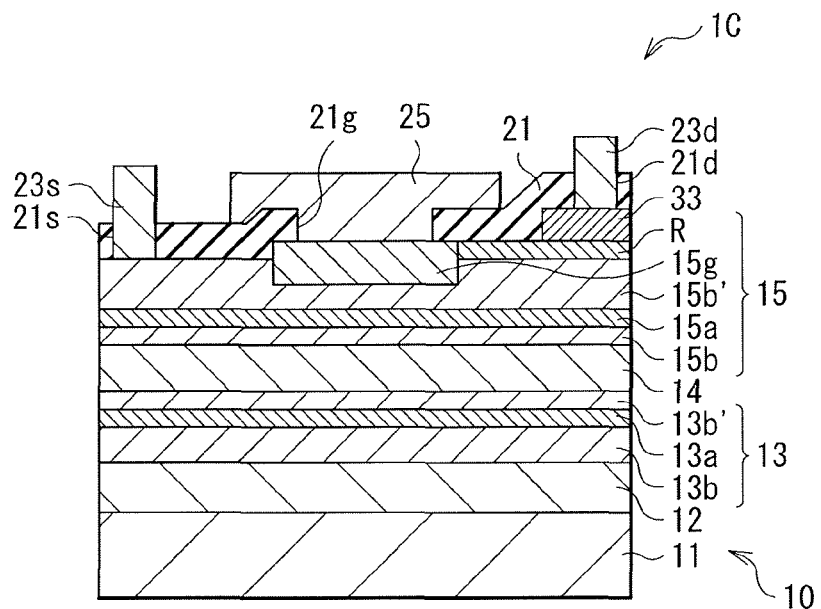
[ FIG. 11A ]
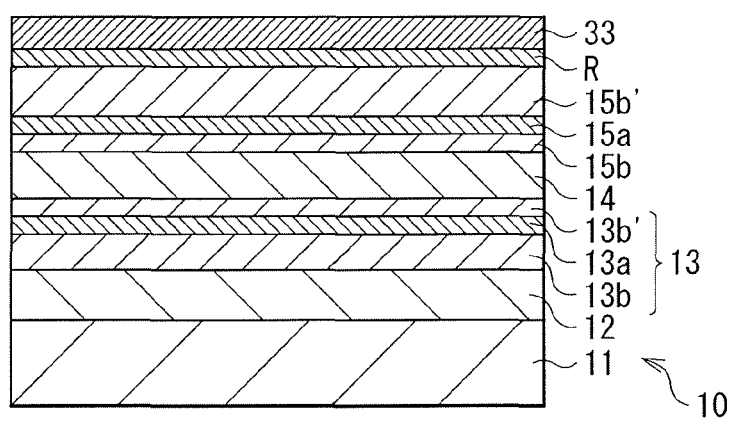

[ FIG. 11B ]
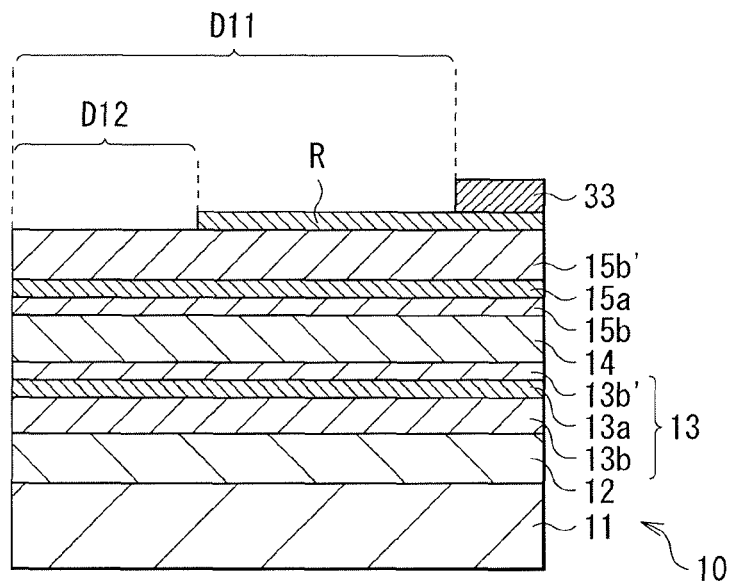
[ FIG. 11C ]
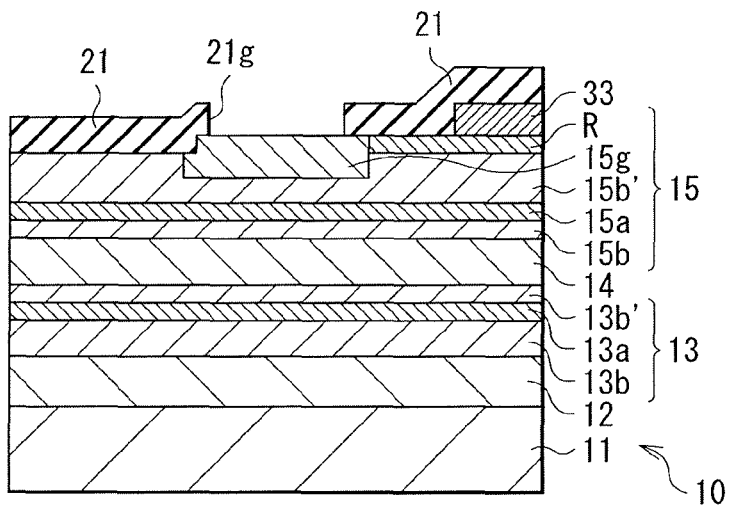

[ FIG. 11D ]
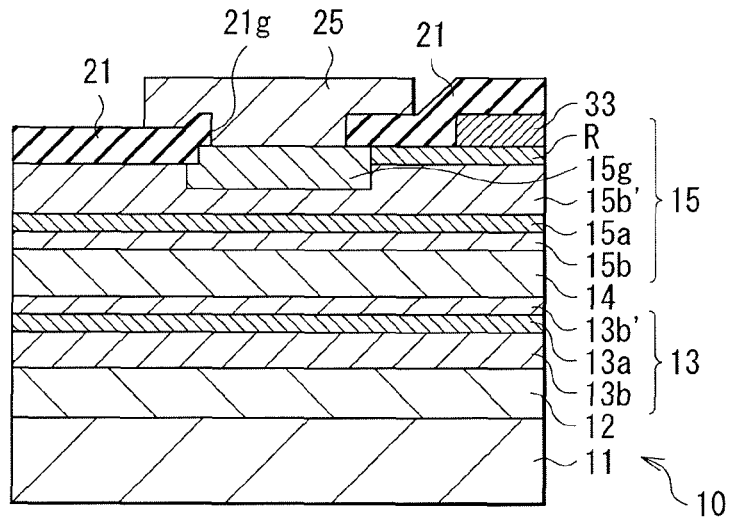
[ FIG. 12 ]
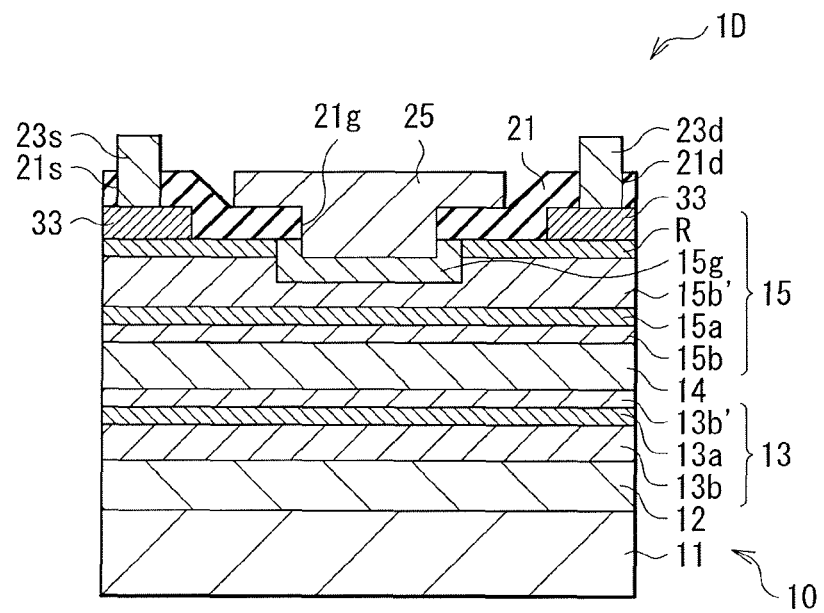

[ FIG. 13A ]
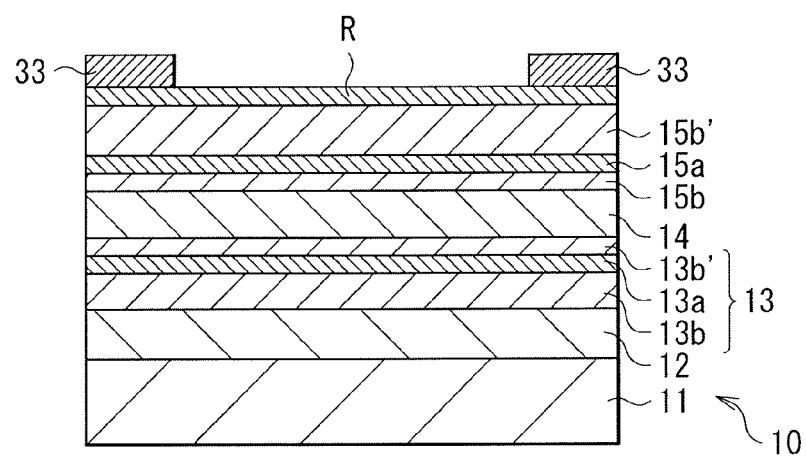
[ FIG. 13B ]
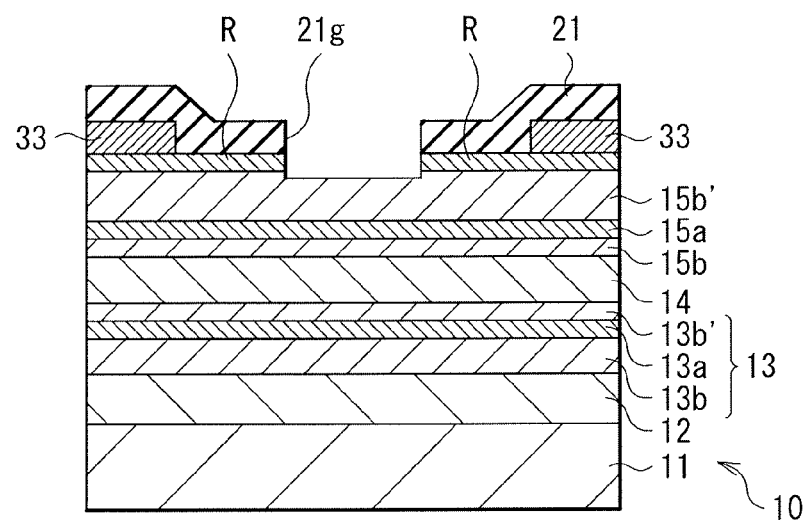

[ FIG. 13C ]
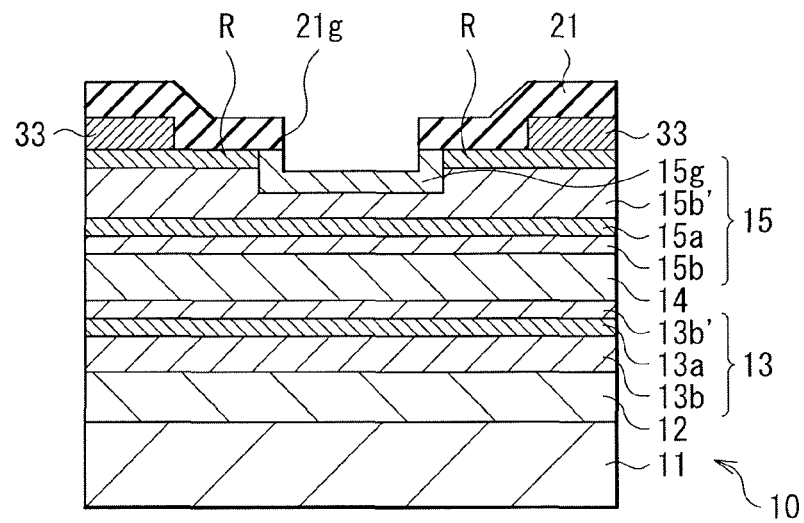
[ FIG. 13D ]
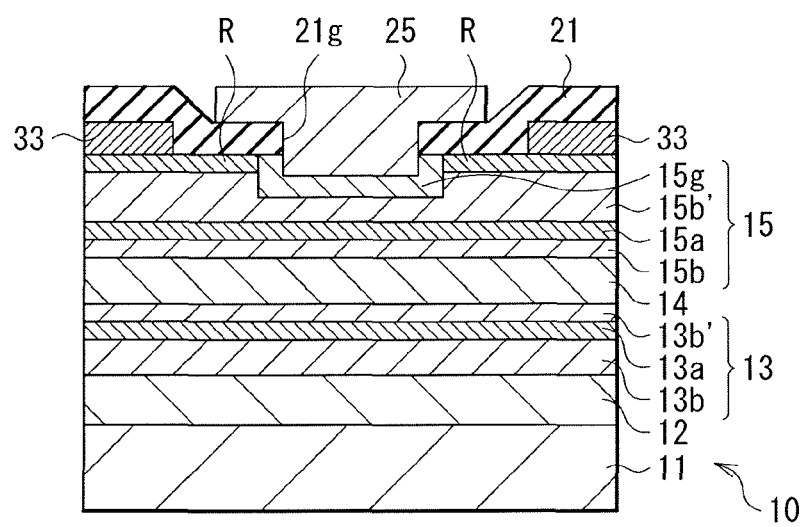

[ FIG. 14 ]
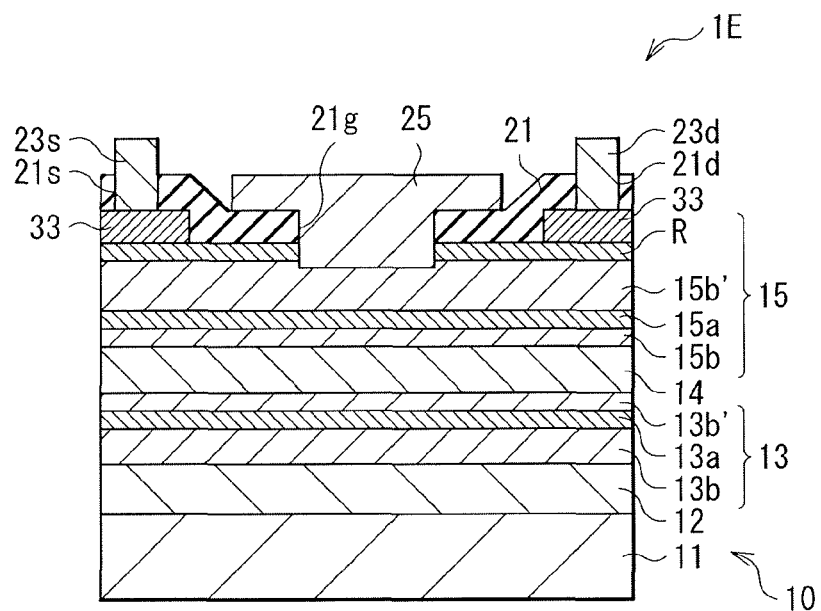
[ FIG. 15 ]
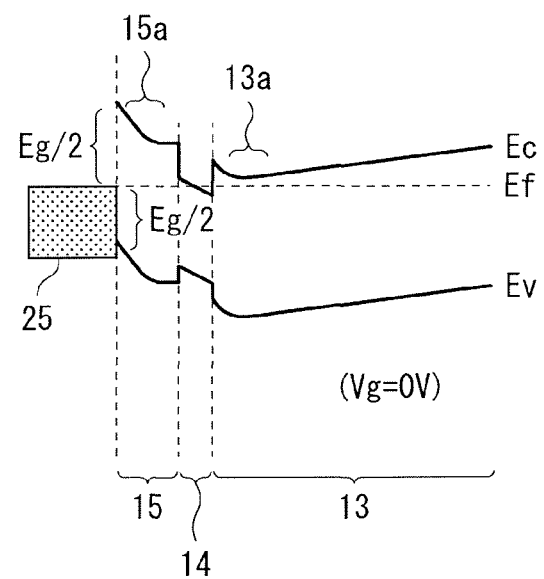

[ FIG. 16 ]
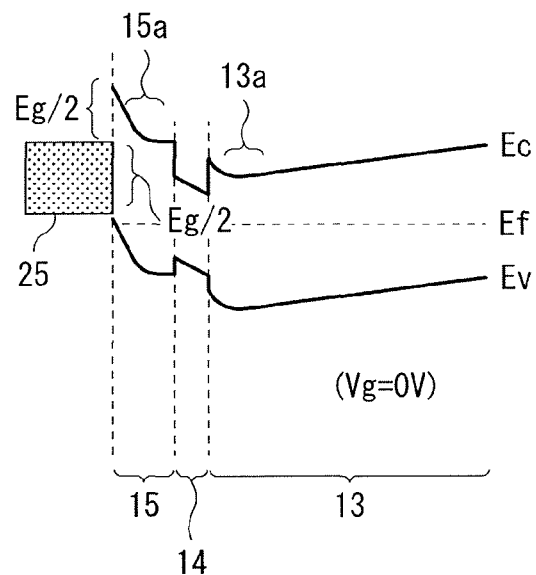
[ FIG. 17 ]
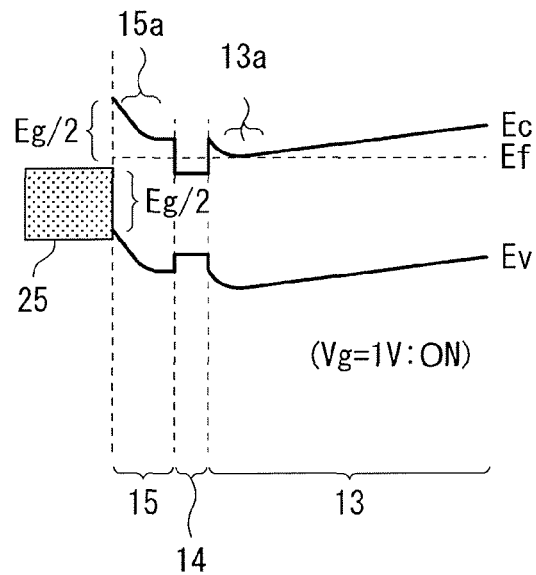

[ FIG. 18 ]
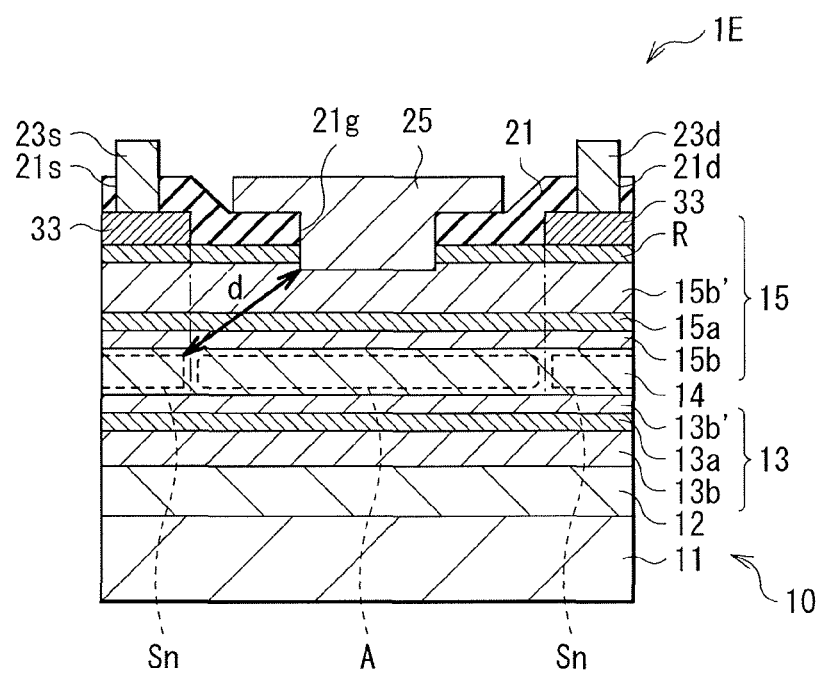

[FIG. 19]
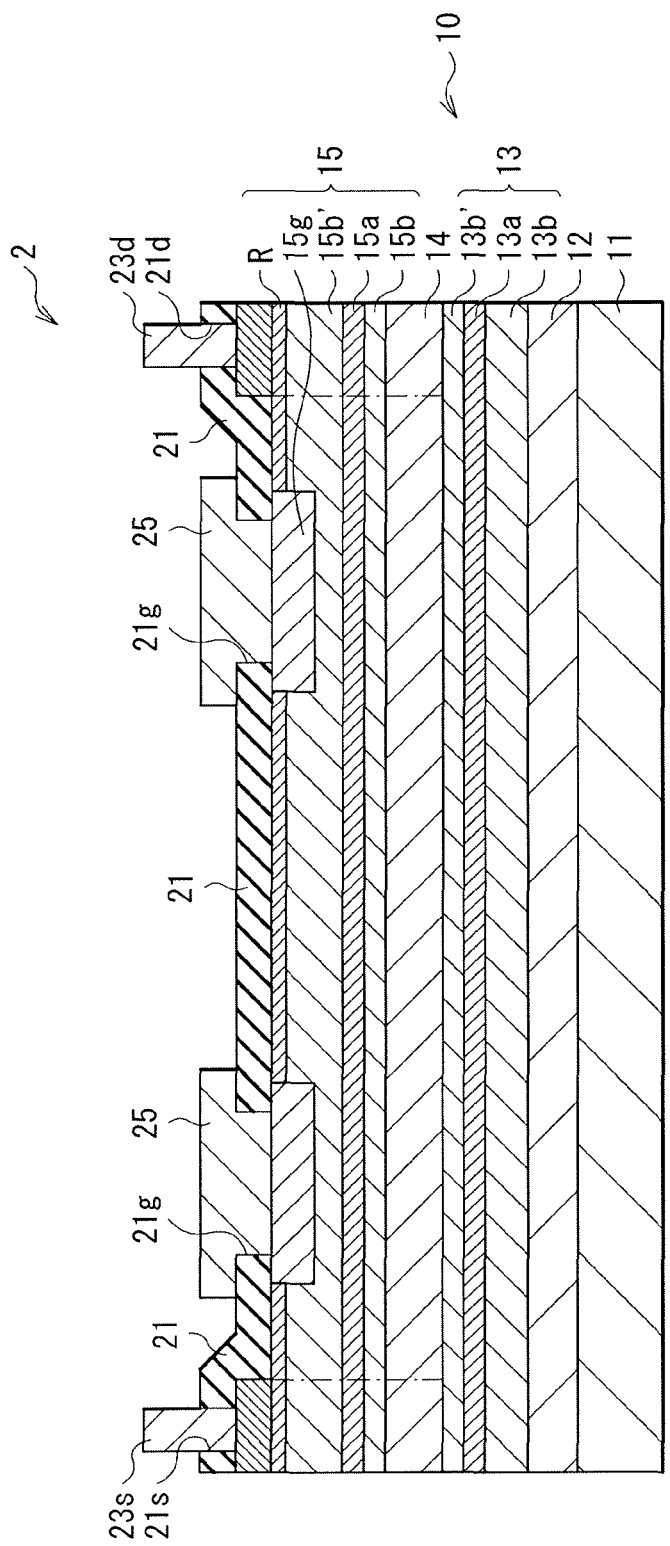

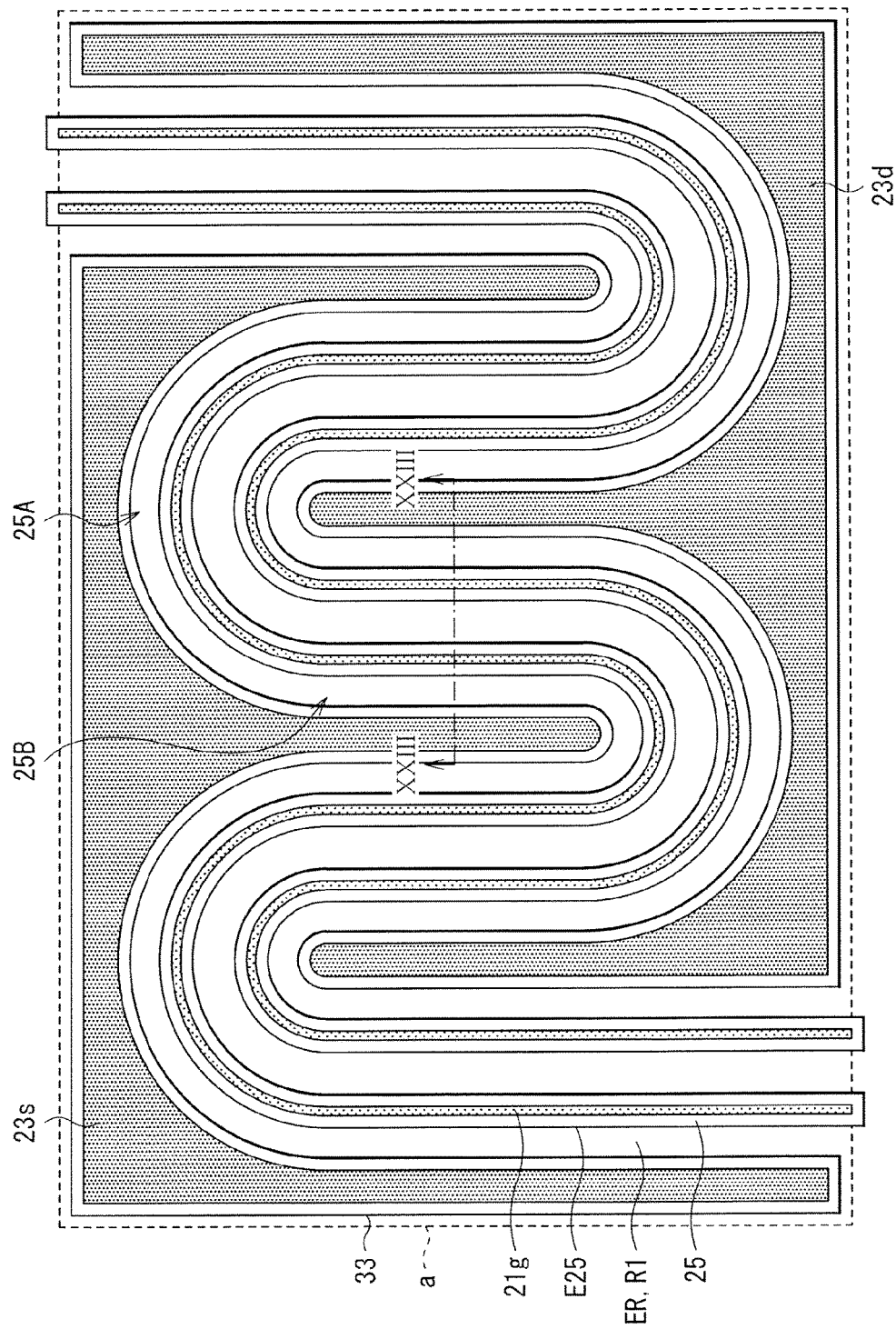
[FIG. 20]

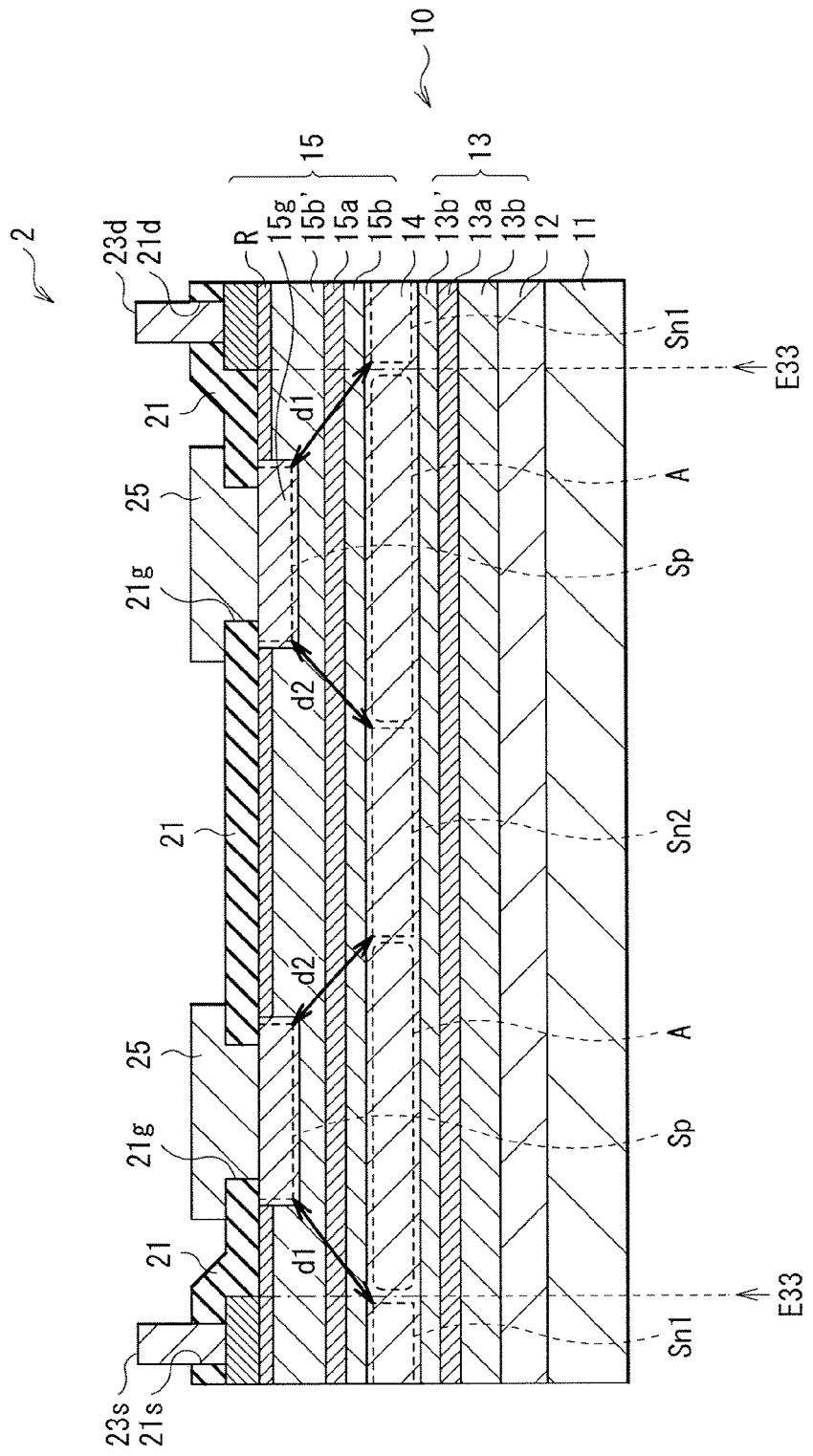
[FIG. 21]

[ FIG. 22 ]
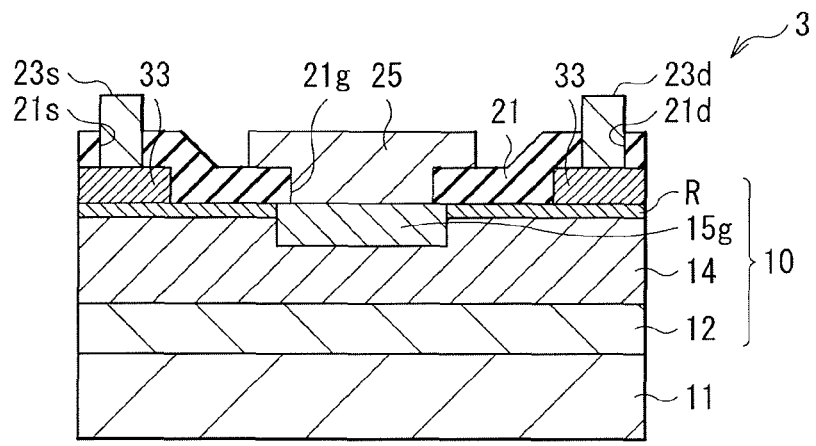
[ FIG. 23 ]
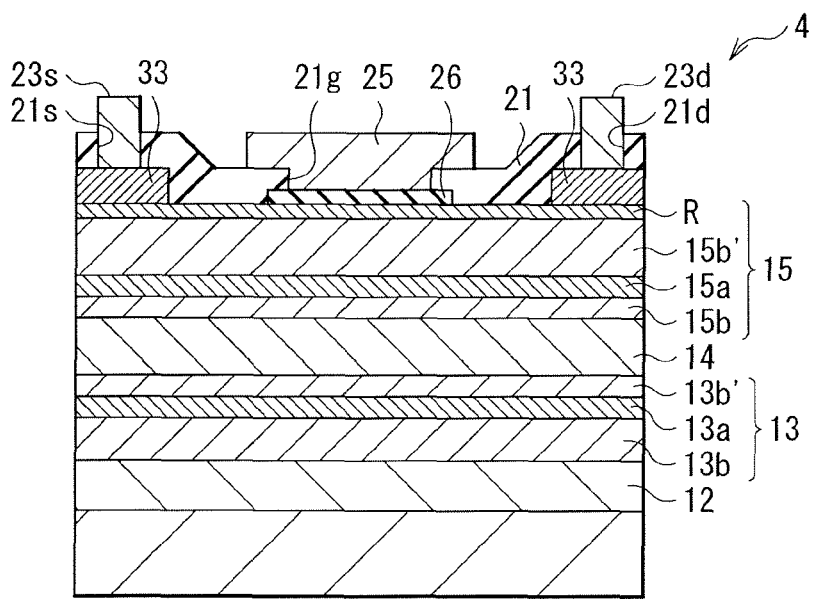

[ FIG. 24 ]
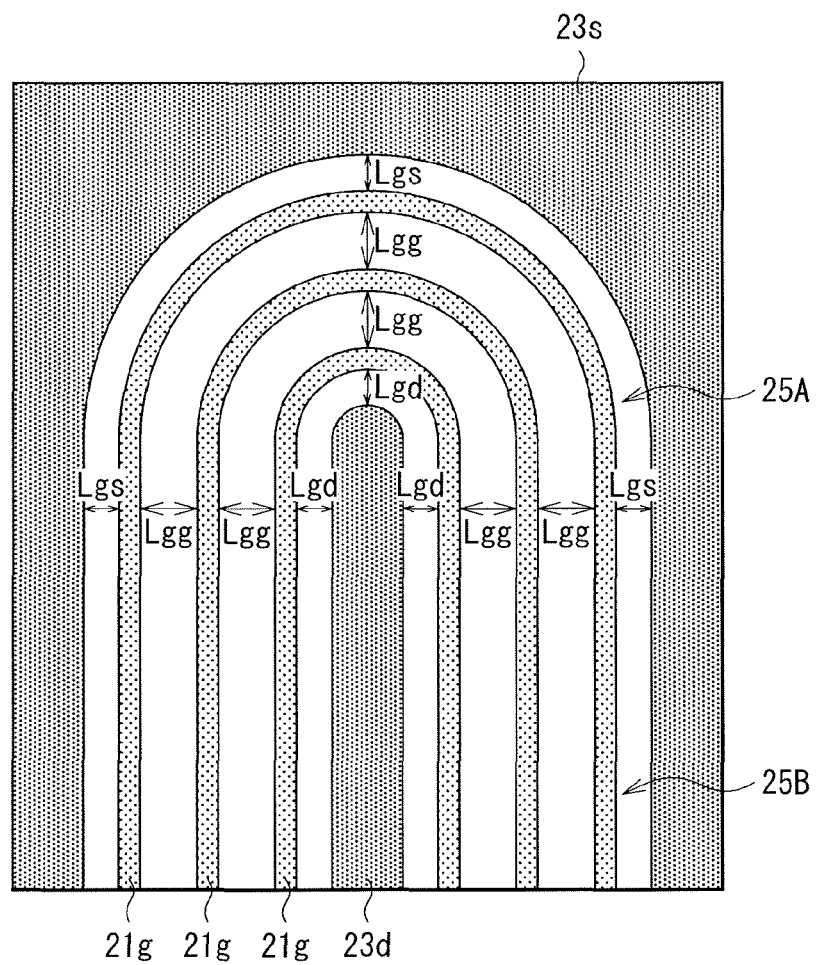

[ FIG. 25 ]
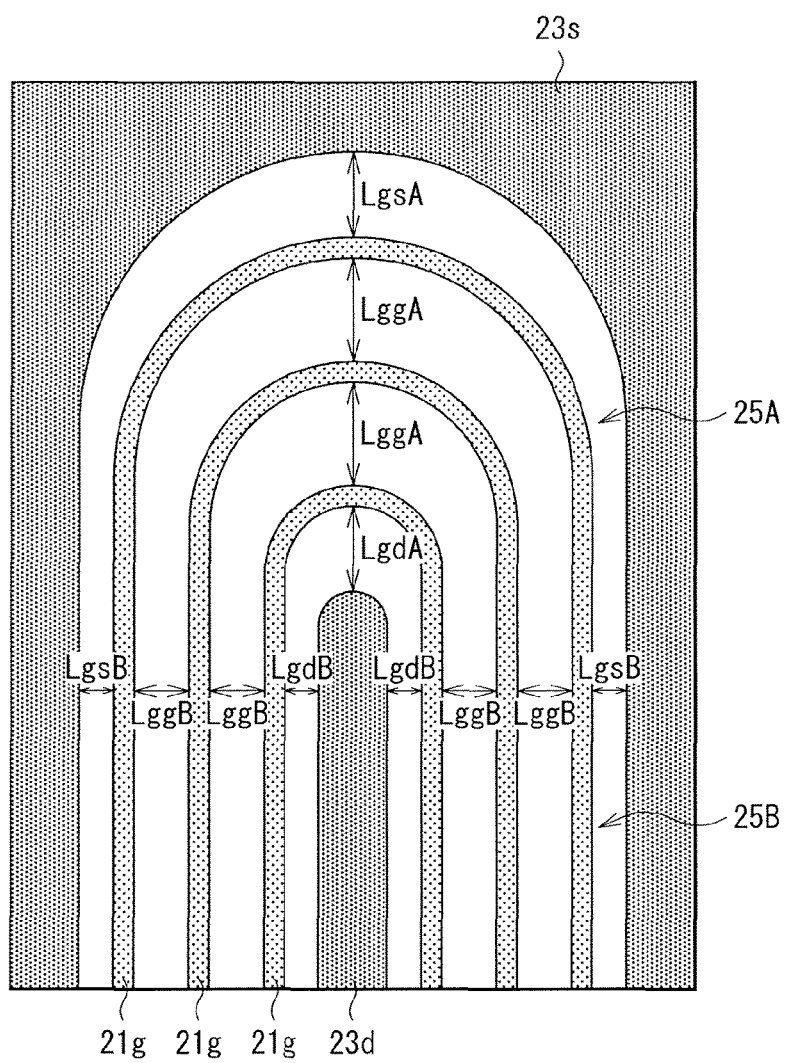

[ FIG. 26 ]
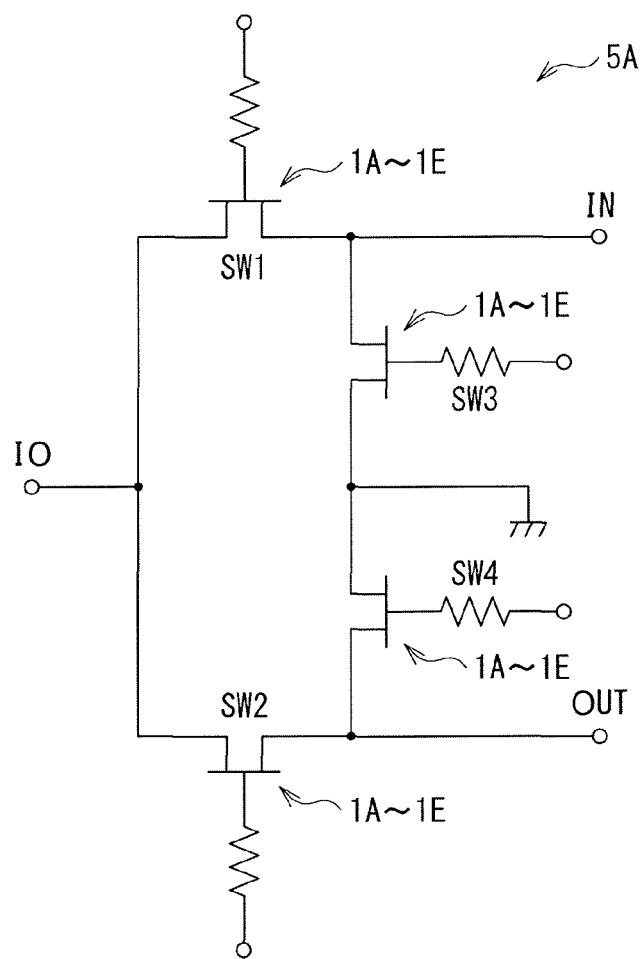

[ FIG. 27 ]
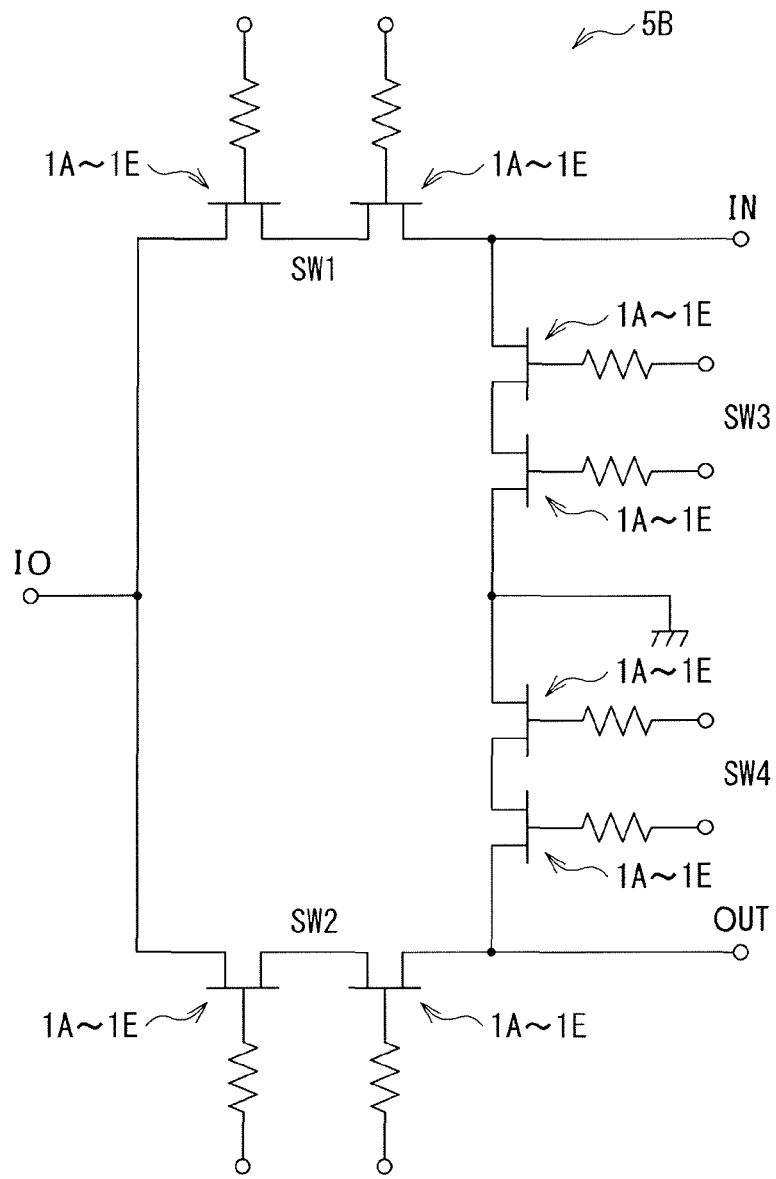

[ FIG. 28 ]
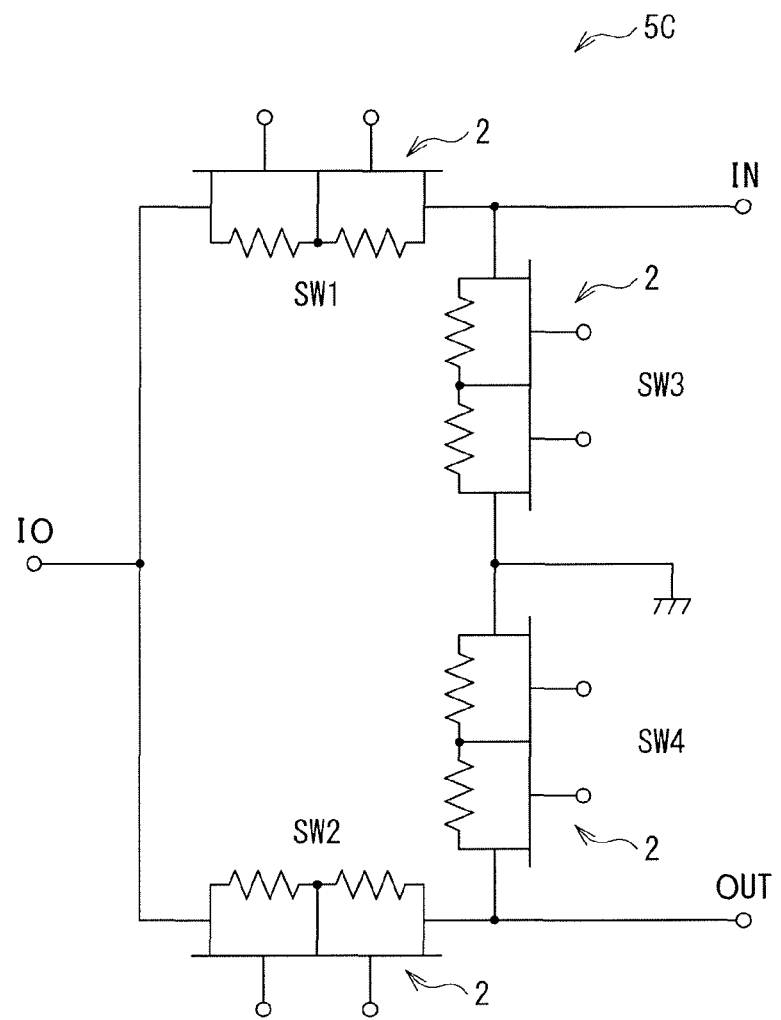

[ FIG. 29 ]
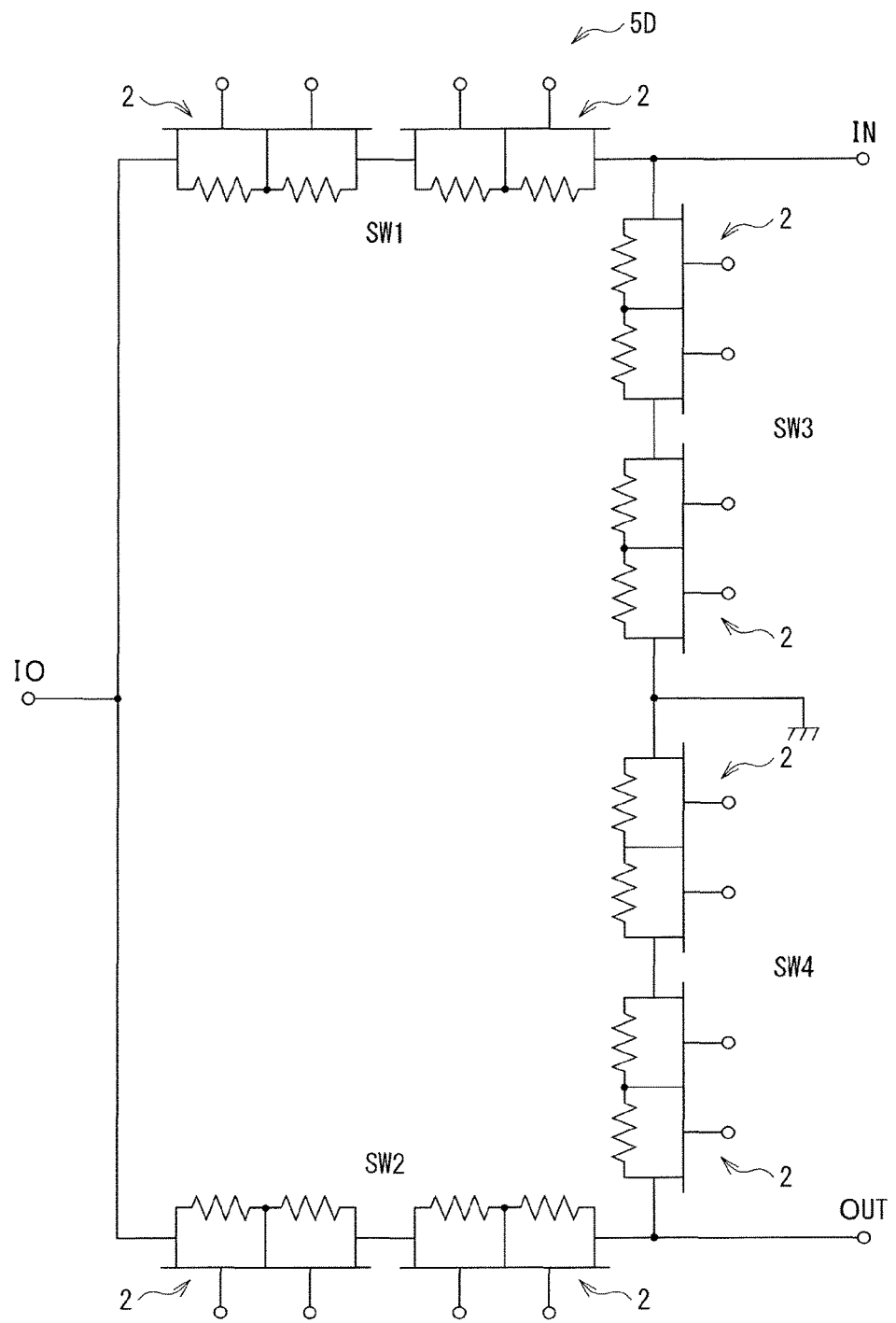

[ FIG. 30 ]
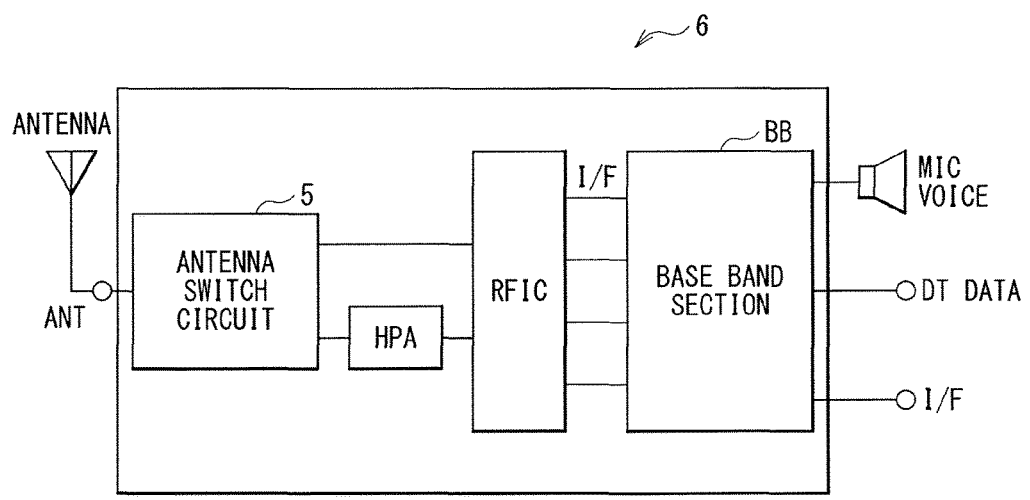

SEMICONDUCTOR DEVICE, ANTENNA SWITCH CIRCUIT, AND WIRELESS COMMUNICATION APPARATUS

TECHNICAL FIELD

The technology relates to a semiconductor device, an antenna switch circuit, and a wireless communication apparatus, and in particular to a semiconductor device having a channel layer made of a compound semiconductor, an antenna switch circuit including the semiconductor device, and a wireless communication apparatus including the antenna switch circuit.

BACKGROUND ART

Recently, in mobile communication systems such as mobile phones, mobile communication terminals have been strongly requested to have a smaller size and lower power consumption. In order to achieve these requests, it is necessary to reduce ON-resistance Ron and OFF-capacitance Coff in an antenna switch, for example. One example of a device that is currently put into practical use for such an antenna switch is a junction pseudo-morphic high electron mobility transistor (JPHEMT).

The JPHEMT is a semiconductor device that performs current modulation utilizing a PN junction and a heterojunction. Such a semiconductor device includes, for example, a heterojunction between a channel layer made of InGaAs and a barrier layer (AlGaAs) made of AlGaAs having a wider bandgap than that of the channel layer (InGaAs). Inside the barrier layer (AlGaAs), a second low resistance region containing impurities of a reverse electrically conductive type is provided on a surface layer opposite to the channel layer, and a gate electrode is coupled to the second low resistance region. Further, inside the barrier layer (AlGaAs), a carrier supply region containing impurities that serve as carriers is provided closer to the channel layer than the second low resistance region. Further, a source electrode and a drain electrode are ohmic-bonded to the barrier layer (AlGaAs) on both sides of the second low resistance region and the gate electrode.

In the semiconductor device configured as described above, a two-dimensional electron gas layer in which electrons serving as carriers are confined at high concentration is formed at an interface, in the channel layer, on side of the barrier layer. By applying a voltage to the gate electrode to control the concentration of the two-dimensional electron gas layer, a current is modulated that flows between the source electrode and the drain electrode via the channel layer portion below the second low resistance region (see, e.g., PTL 1 listed below for the above description).

CITATION LIST

Patent Literature

PTL 1: Japanese Unexamined Patent Application Publication No. H11-150264

SUMMARY OF INVENTION

In the above-described semiconductor device, increasing the concentration of impurities in a carrier supply region provided in a barrier layer allows the carrier concentration of a two-dimensional electron gas layer inside a channel layer to be high, thus enabling ON-resistance Ron to be low. On the other hand, high carrier concentration of the two-dimensional electron gas layer makes a depletion layer less likely to be expanded between a second low resistance region in the barrier layer and a channel layer, thus allowing OFF-capacitance Coff to be high. Further, electric field concentration at a PN junction is more likely to occur, resulting in decreased withstand pressure during an OFF state. In other words, an ON-operation (Ron) and an OFF-operation (Coff, withstand pressure) are in a trade-off relationship. Accordingly, it has been difficult to enhance the carrier concentration inside the channel layer by raising the concentration of impurities.

It is therefore desirable to provide a semiconductor device making it possible to reduce OFF-capacitance while reducing ON-resistance, an antenna switch circuit including the semiconductor device, and a wireless communication apparatus including the antenna switch circuit.

A semiconductor device according to an embodiment of the technology includes a layered body, a gate electrode, a source electrode, a drain electrode, and a cap layer. The layered body includes a channel layer and a first low resistance region. The channel layer is made of a compound semiconductor. The first low resistance region is provided in a portion on surface side of the layered body. The gate electrode, the source electrode, and the drain electrode are each provided on top surface side of the layered body. The cap layer is provided between the first low resistance region and one or both of the source electrode and the drain electrode.

In the semiconductor device according to the embodiment of the technology, the first low resistance region is provided on a portion on surface side of the layered body, and the cap layer is provided between the first low resistance region and one or both of the source electrode and the drain electrode. This allows a carrier depletion region formed in the channel layer during the OFF-operation to be expanded from a region below the gate electrode to a region below the first low resistance region. Thus, even when the carrier concentration of the channel layer is raised to reduce the ON-resistance, the width of the depletion layer during the OFF-operation is enlarged. Further, providing the cap layer makes it possible to secure a large distance from the source electrode or the drain electrode to the channel layer. As a result, it becomes possible to reduce contact resistance as well as dispersion in the contact resistance.

An antenna switch circuit according to an embodiment of the technology includes a first terminal, a second terminal, a third terminal, a first switching device, and a second switching device. The first terminal receives a transmission signal. The second terminal is coupled to an antenna. The third terminal outputs a reception signal received by the antenna. The first switching device is coupled between the first terminal and the second terminal. The second switching device is coupled between the second terminal and the third terminal. During signal transmission, the first switching device is brought into an electrically conductive state, and the second switching device is brought into an electrically non-conductive state. During signal reception, the first switching device is brought into the electrically non-conductive state, and the second switching device is brought into the electrically conductive state. One or both of the first switching device and the second switching device are configured by the semiconductor device of the technology.

In the antenna switch circuit according to the embodiment of the technology, the first switching device is brought into an electrically conductive state and the second switching device is brought into an electrically non-conductive state during signal transmission, to allow the transmission signal to be inputted from the first terminal and to be outputted to the second terminal through the first switching device. During signal reception, the first switching device is brought into the electrically non-conductive state and the second switching device is brought into the electrically conductive state to allow the reception signal received by the antenna to be inputted from the second terminal and to be outputted to the third terminal through the second switching device.

A wireless communication apparatus according to an embodiment of the technology includes an antenna and an antenna switch circuit. The antenna switch circuit performs switching between an input of a transmission signal to the antenna and an output of a reception signal received by the antenna. The antenna switch circuit is configured by the antenna switch circuit according to the technology.

In the wireless communication apparatus according to the embodiment of the technology, the antenna switch circuit performs switching between an input of a transmission signal to the antenna and an output of a reception signal received by the antenna.

According to the semiconductor device of the embodiment of the technology, the cap layer is provided between the first low resistance region provided on top surface side of the layered body and one or both of the source electrode and the drain electrode, thus making it possible to expand a depletion layer during the OFF-operation to reduce the OFF-capacitance. Further, intervention of the cap layer enables a large distance from the source electrode or the drain electrode to the channel layer to be secured, thus making it possible to reduce the contact resistance as well as dispersion in the contact resistance. As a result, it is possible to reduce the ON-resistance as well as dispersion in the ON-resistance. Thus, it becomes possible to reduce the OFF-capacitance while reducing the ON-resistance.

According to the antenna switch circuit of the embodiment of the technology and the wireless communication apparatus of the embodiment of the technology, one or both of the first switching device and the second switching device of the antenna switch circuit are configured by the semiconductor device of the technology. This therefore allows the first switching device or the second switching device to have low OFF-capacitance and excellent harmonic distortion. Thus, it becomes possible to allow the wireless communication apparatus to have a smaller size and lower power consumption.

It is to be noted that that the contents described above are mere examples of the disclosure. The effects of the disclosure are not limited to those described above, and may be other different effects, or may further include other effects in addition to the effects described above.

BRIEF DESCRIPTION OF DRAWINGS

FIG. 1 is a cross-sectional view of a configuration of a key part of a semiconductor device according to a first embodiment of the technology.

FIG. 2 is a top view of the semiconductor device illustrated in FIG. 1.

FIG. 3 is an energy band structure diagram in a junction state of the semiconductor device illustrated in FIG. 1.

FIG. 4 is an energy band structure diagram during an OFF-operation of the semiconductor device illustrated in FIG. 1.

FIG. 5 is an energy band structure diagram during an ON-operation of the semiconductor device illustrated in FIG. 1.

FIG. 6 is a schematic diagram illustrating formation of a carrier depletion region during the OFF-operation of the semiconductor device illustrated in FIG. 1.

FIG. 7A is an explanatory cross-sectional view of a process for manufacturing the semiconductor device illustrated in FIG. 1.

FIG. 7B is a cross-sectional view of a process subsequent to FIG. 7A.

FIG. 7C is a cross-sectional view of a process subsequent to FIG. 7B.

FIG. 7D is a cross-sectional view of a process subsequent to FIG. 7C.

FIG. 8 is a characteristic diagram of a relationship between a gate voltage Vg and an OFF-capacitance Coff, illustrating results of a simulation performed for the semiconductor device illustrated in FIG. 1 and a semiconductor device according to a comparative example.

FIG. 9 is a cross-sectional view of a configuration of a key part of a semiconductor device according to a second embodiment of the technology.

FIG. 10 is a cross-sectional view of a configuration of a key part of a semiconductor device according to a third embodiment of the technology.

FIG. 11A is an explanatory cross-sectional view of a process for manufacturing the semiconductor device illustrated in FIG. 10.

FIG. 11B is a cross-sectional view of a process subsequent to FIG. 11A.

FIG. 11C is a cross-sectional view of a process subsequent to FIG. 11B.

FIG. 11D is a cross-sectional view of a process subsequent to FIG. 11C.

FIG. 12 is a cross-sectional view of a configuration of a key part of a semiconductor device according to a fourth embodiment of the technology.

FIG. 13A is an explanatory cross-sectional view of a process for manufacturing the semiconductor device illustrated in FIG. 12.

FIG. 13B is a cross-sectional view of a process subsequent to FIG. 13A.

FIG. 13C is a cross-sectional view of a process subsequent to FIG. 13B.

FIG. 13D is a cross-sectional view of a process subsequent to FIG. 13C.

FIG. 14 is a cross-sectional view of a configuration of a key part of a semiconductor device according to a fifth embodiment of the technology.

FIG. 15 is an energy band structure diagram in a junction state of the semiconductor device illustrated in FIG. 14.

FIG. 16 is an energy band structure diagram during an OFF-operation of the semiconductor device illustrated in FIG. 14.

FIG. 17 is an energy band structure diagram during an ON-operation of the semiconductor device illustrated in FIG. 14.

FIG. 18 is a schematic diagram illustrating formation of a carrier depletion region during the OFF-operation of the semiconductor device illustrated in FIG. 14.

FIG. 19 is a cross-sectional view of a configuration of a key part of a semiconductor device according to a sixth embodiment of the technology.

FIG. 20 is a top view of the semiconductor device illustrated in FIG. 19.

FIG. 21 is a schematic diagram illustrating formation of a carrier depletion region during an OFF-operation of the semiconductor device illustrated in FIG. 19.

FIG. 22 is a cross-sectional view of an example of a configuration of a key part of a semiconductor device according to Modification Example 1.

FIG. 23 is a cross-sectional view of an example of a configuration of a key part of a semiconductor device according to Modification Example 2.

FIG. 24 is an enlarged plan view of an example of a turn portion in a semiconductor device according to Modification Example 3.

FIG. 25 is an enlarged plan view of another example of a turn portion in the semiconductor device according to Modification Example 3.

FIG. 26 is a circuit diagram illustrating an example of an antenna switch circuit.

FIG. 27 is a circuit diagram illustrating another example of the antenna switch circuit.

FIG. 28 is a circuit diagram illustrating yet another example of the antenna switch circuit.

FIG. 29 is a circuit diagram illustrating yet another example of the antenna switch circuit.

FIG. 30 is a block diagram illustrating an example of a wireless communication apparatus.

DESCRIPTION OF EMBODIMENTS

Some embodiments of the technology are described below in the following order with reference to drawings.
1. First Embodiment (An example of providing a cap layer between a first low resistance region and a source electrode and between a first low resistance region and a drain electrode)
2. Second Embodiment (An example of providing a high resistance region on a first low resistance region)
3. Third Embodiment (An example of providing a cap layer only between a first low resistance region and a drain electrode)
4. Fourth Embodiment (An example of a case of removing a first low resistance region upon opening of a gate)
5. Fifth Embodiment (An example of a layered body using Schottky junction)
6. Sixth Embodiment (An example in which a multi-gate structure is provided)
7. Modification Example 1 (An example in which layers on top of a substrate are not lattice-matched between each other)
8. Modification Example 2 (JFET and MISJPHEMT)
9. Modification Example 3 (An example in which a difference is made in device parameters between a turn portion and a linear portion)
10. Modification Example 4 (An example of application to a GaN-based material)
11. Application Examples (Antenna switch circuit and wireless communication apparatus)

It is to be noted that any components which are in common in the respective embodiments are denoted with the same reference numerals, and overlapped descriptions are omitted.
[1. First Embodiment]
(An Example of Providing a Cap Layer Between a First Low Resistance Region and a Source Electrode and Between a First Low Resistance Region and a Drain Electrode)

In the present first embodiment, description is given, with reference to each of the drawings, of a configuration of a semiconductor device of a first embodiment to which the technology is applied, a band structure of the semiconductor device of the first embodiment, an operation of the semiconductor device of the first embodiment, a method of manufacturing the semiconductor device of the first embodiment, and effects of the semiconductor device of the first embodiment, in this order.
[Configuration]

FIG. 1 is a cross-sectional view of a configuration of a key part of a semiconductor device (semiconductor device 1A) according to a first embodiment to which the technology is applied. Further, FIG. 2 is a top view of the semiconductor device 1A. FIG. 3 is an energy band structure diagram in a junction state of the semiconductor device 1A. Description is given below, with reference to these drawings, of a detailed configuration of the semiconductor device of the first embodiment. It is to be noted that description is given below on the assumption that a first electrically conductive type is n type, and a second electrically conductive type is p type; however, an inversed configuration may also be adopted.

The semiconductor device 1A includes a layered body 10 including a channel layer 14 made of a compound semiconductor, and a gate electrode 25 provided on top surface side of the layered body 10.

The semiconductor device 1A may be a so-called junction pseudo-morphic high electron mobility transistor (JPHEMT) that includes a barrier layer between a gate electrode and a channel layer, with a low resistance region of a reverse electrically conductive type being provided inside the barrier layer. In the semiconductor device 1A, a buffer layer 12, a lower barrier layer 13, a channel layer 14, an upper barrier layer 15, and a cap layer 33 which are made of respective compound semiconductor materials may be stacked in this order on a substrate 11 made of a compound semiconductor. The buffer layer 12, the lower barrier layer 13, the channel layer 14, and the upper barrier layer 15 may configure the layered body 10. A carrier supply region 13$a$ may be provided inside the lower barrier layer 13, and a carrier supply region 15$a$ may be provided inside the upper barrier layer 15. Further, in the present embodiment, a second low resistance region 15$g$ may be provided on surface side (top surface side of the layered body) of the upper barrier layer 15. A first low resistance region R may be provided at each of both sides of the second low resistance region 15$g$ in such a manner as to be continuous to the second low resistance region 15$g$.

An insulating film 21 may be provided on the layered body 10 as described above in such a manner as to cover the cap layer 33. In the insulating film 21, there may be provided a source opening 21$s$ and a drain opening 21$d$, as well as a gate opening 21$g$ between the source opening 21$s$ and the drain opening 21$d$. A source electrode 23$s$ and a drain electrode 23$d$ which are coupled to the cap layer 33 respectively through the source opening 21$s$ and the drain opening 21$d$ may be provided on such an insulating film 21. Further, a gate electrode 25 that is coupled to the second low resistance region 15$g$ of the upper barrier layer 15 through the gate opening 21$g$ may be provided on the insulating film 21.

It is to be noted that, although FIG. 1 illustrates a case where an end ER of the first low resistance region R is positioned outside an end E25 of the gate electrode 25, the end ER of the first low resistance region R is not necessarily positioned outside the end E25 of the gate electrode 25.

More specifically, the second low resistance region 15$g$ may be provided in a region facing the gate opening 21$g$ on top surface side of the layered body 10. However, the second low resistance region 15g may not only lie in the region facing the gate opening 21g but also protrude to a surrounding region thereof. The first low resistance region R may be formed on top surface side of the layered body 10 continuously from the second low resistance region 15g, and may extend to regions facing the source electrode 23s and the drain electrode 23d.

Description is given below of a detailed configuration of each of the above-mentioned components that configure the semiconductor device 1A, sequentially in an order from the substrate 11.

[Substrate 11]

The substrate 11 may be made of a semi-insulating compound semiconductor material. Such a substrate 11 may be made of, for example, a group III-V compound semiconductor material, and, for example, a semi-insulating single-crystal GaAs substrate or an InP substrate may be used therefor.

[Buffer Layer 12]

The buffer layer 12 may be made of, for example, a compound semiconductor layer that is subjected to epitaxial growth on the substrate 11, and may be made of a compound semiconductor that is well lattice-matched to the substrate 11 and the lower barrier layer 13. For example, when the substrate 11 is configured by a single-crystal GaAs substrate, an epitaxial growth layer of u-GaAs that is not doped with any impurities ("u-" denotes undoped; the same applies hereinafter) may be used as an example of such a buffer layer 12.

[Lower Barrier Layer 13]

The lower barrier layer 13 may be made of, for example, a group III-V compound semiconductor that is well lattice-matched to the buffer layer 12 and the channel layer 14 on top of the lower barrier layer 13 and has a bandgap wider than that of a compound semiconductor material configuring the channel layer 14. As an example of such a lower barrier layer 13, an epitaxial growth layer of an AlGaAs mixed crystal may be used. Here, in particular, it is assumed that the lower barrier layer 13 may be made of an $Al_{0.2}Ga_{0.8}As$ mixed crystal in which the composition ratio of aluminum (Al) in group III elements is 0.2.

Such a lower barrier layer 13 may include the carrier supply region 13a containing impurities that supply carriers. Here, it is assumed that electrons may be used as the carriers, and the n-type carrier supply region 13a containing n-type impurities as impurities that supply the electrons may be arranged at a middle portion in a film thickness direction of the lower barrier layer 13. Silicon (Si) may be used as the n-type impurities in the lower barrier layer 13 made of the $Al_{0.2}Ga_{0.8}As$ mixed crystal.

Further, a portion of the lower barrier layer 13 in the film thickness direction other than the carrier supply region 13a may be formed as high resistance regions 13b and 13b' that are undoped or contain low-concentrated n-type impurities or p-type impurities. Each of the high resistance regions 13b and 13b' may preferably have an impurity concentration of $1\times10^{17}$ pieces/cm$^3$ or lower and a specific resistance of $1\times10^{-2}$ ohm ($\Omega$) cm or higher.

One example of a specific configuration of the lower barrier layer 13 as described above is as follows. The high resistance region 13b that has a film thickness of about 200 nm and does not contain impurities may be provided on side of the buffer layer 12. On top of the high resistance region 13b, the carrier supply region 13a may be stacked which has a film thickness of about 4 nm and contains silicon (Si) of about $1.6\times10^{12}$ pieces/cm$^2$. Further, on top of the carrier supply region 13a, the high resistance region 13b' may be stacked which has a film thickness of about 2 nm and does not contain impurities.

It is to be noted that the lower barrier layer 13 may not include the high resistance regions 13b and 13b', and an entire region of the lower barrier layer 13 may be configured as the carrier supply region 13a.

[Channel Layer 14]

The channel layer 14, which serves as a current path between the source electrode 23s and the drain electrode 23d, may be a layer on which carriers supplied from the carrier supply region 13a of the lower barrier layer 13 and the carrier supply region 15a of the upper barrier layer 15 described later are accumulated. Such a channel layer 14 may be made of a compound semiconductor that forms a heterojunction with the lower barrier layer 13, and may be well lattice-matched to the lower barrier layer 13. Further, it is assumed that the channel layer 14 may be made of a compound semiconductor in which an energy band on carrier-traveling side at the heterojunction with the lower barrier layer 13 is closer to an intrinsic Fermi level within the channel layer than an energy band on carrier-traveling side in a compound semiconductor material that forms an interface region of the lower barrier layer 13. Accordingly, it follows that the lower barrier layer 13 may be made of a compound semiconductor in which an energy band on carrier-traveling side at a heterojunction with the channel layer 14 is more distant from the intrinsic Fermi level within the channel layer than the channel layer 14.

In other words, it is assumed that the channel layer 14 may be made of a compound semiconductor in which an energy band on majority-carrier-traveling side at the heterojunction with the lower barrier layer 13 is closer to an energy band on minority-carrier-traveling side than an energy band on majority-carrier-traveling side in a compound semiconductor material that forms an interface region of the lower barrier layer 13. It is to be noted that the intrinsic Fermi level within the channel layer is located midway between the lowest energy at a conduction band of the channel layer 14 (hereinafter, referred to as a conduction band energy Ec) and the highest energy at a valence band (hereinafter, referred to as a valence band energy Ev).

Here, when the carriers are electrons, the energy band on carrier-traveling side may be a conduction band. Therefore, the channel layer 14 may be made of a group III-V compound semiconductor material whose conduction band energy Ec is at least lower than that of a compound semiconductor material forming the lower barrier layer 13 at a junction with the lower barrier layer 13. For such a channel layer 14, it may be preferable that a difference in the conduction band energy Ec between the channel layer 14 and the lower barrier layer 13 be larger at the junction with the lower barrier layer 13.

In contrast, when the carriers are holes, the energy band on carrier-traveling side may be a valence band. Therefore, the channel layer 14 may be made of a compound semiconductor material whose valence band energy Ev is at least higher than that of a compound semiconductor material forming the lower barrier layer 13 at the junction with the lower barrier layer 13. For such a channel layer 14, it may be preferable that a difference in the valence band energy Ev between the channel layer 14 and the lower barrier layer 13 be larger at the junction with the lower barrier layer 13. It is to be noted that description is given below by exemplifying a case where the carriers are electrons; however, when the carriers are holes, the description of the impurities and the energy band may be considered as the description of those of a reverse electrically conductive type.

It is to be noted that, typically, such a channel layer 14 may be made of a group III-V compound semiconductor material that is well lattice-matched to the lower barrier layer 13 and has a bandgap narrower than that of a compound semiconductor material forming the lower barrier layer 13. Further, for such a channel layer 14, it may be preferable that a difference in the bandgap between the channel layer 14 and the lower barrier layer 13 be larger.

For example, when the lower barrier layer 13 is made of the $Al_{0.2}Ga_{0.8}As$ mixed crystal, the channel layer 14 as described above may be made of an InGaAs mixed crystal. In this case, it is possible to narrow down a bandgap in the InGaAs mixed crystal as the composition ratio of indium (In) is made higher, as well as to increase a difference in the conduction band energy Ec between the channel layer 14 and the lower barrier layer 13 made of the AlGaAs mixed crystal. Accordingly, for the InGaAs mixed crystal that forms the channel layer 14, the composition ratio of indium (In) in group III elements may be 0.1 or higher.

As an example, the channel layer 14 may be made of an $In_{0.2}Ga_{0.8}As$ mixed crystal in which the composition ratio of indium (In) in group III elements is 0.2. This allows the channel layer 14 to obtain a sufficient difference in the conduction band energy Ec, while securing a lattice-matching property to the lower barrier layer 13.

Further, the channel layer 14 may be an u-InGaAs mixed crystal that is undoped. This makes it possible to suppress impurity scattering of the carriers in the channel layer 14, thereby allowing for achievement of carrier migration with high mobility.

It is to be noted that the channel layer 14 may be an epitaxial growth layer formed with a film thickness of 15 nm or less. This makes it possible to achieve a layer that secures crystallinity and is excellent in a carrier-traveling performance.

[Upper Barrier Layer 15]

The upper barrier layer 15 may be well lattice-matched to the channel layer 14. The upper barrier layer 15 may be made of a compound semiconductor in which the energy band on carrier-traveling side at the junction with the channel layer 14 is more distant from the intrinsic Fermi level within the channel layer than a compound semiconductor material that forms the channel layer 14. In other words, it is assumed that the upper barrier layer 15 may be made of a compound semiconductor in which the energy band on majority-carrier-traveling side at the junction with the channel layer 14 is more distant from the intrinsic Fermi level within the channel layer than the compound semiconductor material that forms the channel layer 14. When the carriers are electrons, the upper barrier layer 15 may be made of a group III-V compound semiconductor material whose conduction band energy Ec is higher than that of the compound semiconductor material forming the channel layer 14. For such an upper barrier layer 15, it may be preferable that a difference in the conduction band energy Ec between the upper barrier layer 15 and the channel layer 14 be larger at a junction with the channel layer 14.

When the channel layer 14 is made of the InGaAs mixed crystal, the upper barrier layer 15 as described above may be made of, for example, an AlGaAs mixed crystal having a wider bandgap than that of the InGaAs mixed crystal. In this case, it is possible to prevent an increase in a so-called source resistance by keeping the composition ratio of aluminum (Al) at a low value. Further, it is also possible to secure controllability by reducing the diffusion rate in forming the second low resistance region 15g as described next by means of diffusion. Therefore, for the AlGaAs mixed crystal that forms the upper barrier layer 15, the composition ratio of aluminum (Al) in group III elements may be 0.25 or lower.

As an example, the upper barrier layer 15 may be made of an $Al_{0.2}Ga_{0.8}As$ mixed crystal in which the composition ratio of aluminum (Al) in group III elements is 0.2. This makes it possible to secure the lattice-matching property to the channel layer 14. It is to be noted that such an upper barrier layer 15 may not necessarily have the same composition as that of the lower barrier layer 13; the lower barrier layer 13 and the upper barrier layer 15 may be each made of an AlGaAs mixed crystal having a suitable composition. For example, the composition ratio of aluminum (Al) in the upper barrier layer 15 may be set at a lower value than that of the lower barrier layer 13 that does not necessarily include the second low resistance region 15g formed by means of diffusion.

Such an upper barrier layer 15 may have the carrier supply region 15a that contains impurities for supplying carriers. Here, the n-type carrier supply region 15a that contains silicon (Si) as n-type impurities for supplying electrons may be arranged with a film thickness of about 4 nm at a middle portion in the film thickness direction of the upper barrier layer 15.

Further, a region where the carrier supply region 15a is interposed in the film thickness direction in the upper barrier layer 15 may be formed as high resistance regions 15b and 15b' that are undoped or contain low-concentrated impurities. When the high resistance regions 15b and 15b' contain impurities, the high resistance region 15b on channel layer 14 side may contain n-type impurities or p-type impurities. In contrast, the high resistance region 15b' that forms surface side of the upper barrier layer 15, i.e., opposite to the channel layer 14 may contain n-type impurities. Each of the high resistance regions 15b and 15b' may preferably have an impurity concentration of $1 \times 10^{17}$ pieces/cm$^3$ or lower, and a specific resistance of $1 \times 10^{-2}$ ohm ($\Omega$) cm or higher.

Further, on surface side of the upper barrier layer 15 (on top surface side of the layered body 10), there may be provided the second low resistance region 15g and the first low resistance region R. The first low resistance region R may be provided on a surface, of the upper barrier layer 15, opposite to the channel layer 14, and the second low resistance region 15g may be provided at a middle portion of the surface.

One example of a specific configuration of the upper barrier layer 15 as described above is as follows. The high resistance region 15b that has a film thickness of about 2 nm and does not contain impurities may be provided on channel layer 14 side. On top of the high resistance region 15b, the carrier supply region 15a may be stacked that has a film thickness of about 4 nm and contains silicon (Si) of about $1.6 \times 10^{12}$ pieces/cm$^2$. Further, on top of the carrier supply region 15a, the high resistance region 15b' may be stacked that has a film thickness of about 50 nm and does not contain impurities.

On top of the high resistance region 15b', a portion that configures the first low resistance region R may be stacked. Further, the second low resistance region 15g may be provided in such a depth as to reach the high resistance region 15b' from the surface of the first low resistance region R.

It is to be noted that, when the channel layer 14 is made of the InGaAs mixed crystal, the upper barrier layer 15 is not limited to the AlGaAs mixed crystal; the upper barrier layer 15 may be made of an In(AlGa)AsP mixed crystal that is a group III-V compound semiconductor. This makes it possible to increase the composition ratio of indium (In) in the channel layer 14 made of the InGaAs mixed crystal, thereby enhancing the carrier mobility in the channel layer 14.

[Second Low Resistance Region 15g]

The second low resistance region 15g may be provided on a surface layer, in the upper barrier layer 15, opposite to the channel layer 14 at a shallow position closer to the surface than the carrier supply region 15a of the upper barrier layer 15, with an interval from the carrier supply region 15a. The second low resistance region 15g may contain impurities of the electrically conductive type reverse to that of carriers traveling in the channel layer 14, and may be kept at a resistance lower than that of the surrounding high resistance region 15b'. Accordingly, when the carriers are electrons, it follows that p-type impurities may be diffused in the second low resistance region 15g.

A thickness (depth) of such a second low resistance region 15g and a value of the p-type impurity concentration may be determined by a threshold voltage of a transistor. In other words, the threshold voltage may be raised with an increase in thickness of the second low resistance region 15g or with an increase in the p-type impurity concentration. In contrast, the threshold voltage may be lowered with a decrease in thickness of the second low resistance region 15g or with a decrease in the p-type impurity concentration.

For example, the second low resistance region 15g may contain the p-type impurities of $1\times10^{18}$ pieces/cm$^3$ or higher; one example may be about $1\times10^{19}$ pieces/cm$^3$. It is to be noted that carbon (C), zinc (Zn), or magnesium (Mg) may be used as the p-type impurities in the upper barrier layer 15 made of the In(AlGa)AsP mixed crystal. These impurities may be selected as appropriate to be used depending on a method of forming the second low resistance region 15g.

[First Low Resistance Region R]

The first low resistance region R may be formed on a surface layer, in the upper barrier layer 15, opposite to the channel layer 14, and may be so provided as to extend from ends of the second low resistance region 15g to each of regions facing the source electrode 23s and the drain electrode 23d.

Here, the layered bodies 10 may be separated from one another as a device on the substrate 11 (unillustrated in FIG. 1). More specifically, each of the layered bodies 10 may be separated as an island-shaped active region "a", and the first low resistance region R may be provided throughout the active region "a", as illustrated in FIG. 2.

Such a first low resistance region R may be configured as a p-type region that contains impurities (i.e., p-type impurities in this case) of the electrically conductive type reverse to that of carriers traveling in the channel layer 14. It is important that the first low resistance region R may have a smaller p-type charge amount per unit length (per unit lateral length in the drawing) than that in the second low resistance region 15g. It is assumed that the p-type charge amount per unit length in the first low resistance region R may be such an extent that holes inside the first low resistance region R (charges of the electrically conductive type reverse to that of carriers traveling in the channel layer 14) are drained to be brought into a depletion state during OFF-operation where a negative voltage is applied to the gate electrode 25. This makes it possible to allow the first low resistance region R to have a smaller p-type charge amount than that in the second low resistance region 15g even when the lateral length of the first low resistance region R becomes excessively large.

Here, in particular, it is assumed that the first low resistance region R may be formed shallower than the second low resistance region 15g; in other words, the first low resistance region R may be formed with a film thickness smaller than that of the second low resistance region 15g. This may allow the p-type charge amount in the first low resistance region R to be kept smaller than that in the second low resistance region 15g. In this case, for example, the first low resistance region R may contain the p-type impurities of about $1\times10^{18}$ pieces/cm$^3$; one example may be about $1\times10^{18}$ pieces/cm$^3$.

It is to be noted that the first low resistance region R may be configured in the same degree of depth as the second low resistance region 15g, i.e., with the same degree of film thickness as the second low resistance region 15g, as well as with the p-type impurity concentration lower than that in the second low resistance region 15g. In other words, by adjusting one of both of respective film thicknesses and impurity concentrations of the first low resistance region R and the second low resistance region 15g, it becomes possible to set the charge amount of the first low resistance region R to be in a smaller state than the charge amount of the second low resistance region 15g.

As the p-type impurities contained in the first low resistance region R as described above, carbon (C), zinc (Zn), or magnesium (Mg) may be used. These impurities may be selected as appropriate to be used depending on a method of forming the first low resistance region R.

It is to be noted that, for example, reduction in the impurity concentration in the first low resistance region R toward the channel layer 14 may allow a carrier depletion region within the channel layer 14 described later to be extended more easily. On the other hand, reduction in the impurity concentration toward the surface may make the first low resistance region R less likely to be influenced by an interface trap, thus allowing a depletion layer between the first low resistance region R and the channel layer 14 to be controlled more easily during OFF-operation.

Further, the first low resistance region R may be made of a semiconductor material different from that for the high resistance region 15b' as long as the material is a compound semiconductor that is well lattice-matched to the high resistance region 15b'.

[Cap Layer 33]

The cap layer 33 may be provided between the upper barrier layer 15 (more particularly, the first low resistance region R) of the layered body 10 and each of the source electrode 23s and the drain electrode 23d, and may contain impurities (n-type impurities in this case) of the electrically conductive type reverse to that of the second low resistance region 15g (the same electrically conductive type as carriers traveling in the channel layer). It is assumed that the cap layer 33 may be configured as a low resistance region containing a certain amount of the n-type impurities. However, the cap layer 33 may be desirably configured to have a larger n-type charge amount than a p-type charge amount of the first low resistance region R.

Further, the cap layer 33 may be provided in a state of being patterned as an underlayer for the source electrode 23s and the drain electrode 23d.

The cap layer 33 as described above may be made of a compound semiconductor material that is lattice-matched to the upper barrier layer 15 that serves as an underlayer, and may not be necessarily matched to the upper barrier layer 15 in a bandgap. However, when the cap layer 33 is different from the upper barrier layer 15 that serves as the underlayer in the bandgap, a barrier of a potential may be formed at a junction, thus raising a concern that a resistance at an ohmic junction may be increased. Therefore, the bandgap of the cap layer 33 may be matched to the bandgap of the upper barrier layer 15 that serves as the underlayer to such an extent that the characteristics of the semiconductor device 1A may not be influenced. When a surface layer (first low resistance region R in this case) of the upper barrier layer 15 is made of an AlGaAs mixed crystal, the cap layer 33 as described above may be made of, for example, GaAs that contains the n-type impurities. The cap layer 33 may have a thickness of about tens of nanometers (nm), for example. An end E33 of the cap layer 33 may be desirably arranged more outward (in a direction away from the gate electrode 25), because this arrangement allows the carrier depletion region described later to be easily expanded.

[Insulating Film 21]

The insulating film 21 may be provided to cover an entire surface on the upper barrier layer 15. The insulating film 21 may be made of a material having an insulation property against a compound semiconductor that forms the upper barrier layer 15 as well as a function of protecting the surface of the upper barrier layer 15 from impurities such as ions. The insulating film 21 may be made of, for example, silicon nitride ($Si_3N_4$) with a thickness of 200 nm.

Such an insulating film 21 may be provided with the source opening 21s and the drain opening 21d that reach the cap layer 33. Further, the gate opening 21g in such a shape as to expose the second low resistance region 15g may be provided between the source opening 21s and the drain opening 21d in the insulating film 21.

Each of the source opening 21s, the drain opening 21d, and the gate opening 21g may be provided as an independent opening section in the insulating film 21.

[Source Electrode 23s and Drain Electrode 23d]

The source electrode 23s and the drain electrode 23d may be provided to interpose the gate electrode 25 (second low resistance region 15g) therebetween in a plan view. Each of the source electrode 23s and the drain electrode 23d may be ohmic-bonded to the cap layer 33 respectively through the source opening 21s and the drain opening 21d. Each of the source electrode 23s and the drain electrode 23d may have a configuration in which gold-germanium (AuGe), nickel (Ni), and gold (Au) are stacked sequentially in this order from the upper barrier layer 15, with an underlying compound semiconductor layer being alloyed. Each of the source electrode 23s and the drain electrode 23d may have a film thickness of 1,000 nm, for example.

[Gate Electrode 25]

The gate electrode 25 may be provided on top of the second low resistance region 15g. Here, the gate electrode 25 may be so provided as to be embedded in the gate opening 21g, and may be in contact with the second low resistance region 15g throughout the bottom of the gate opening 21g. Such a gate electrode 25 may have a configuration in which titanium (Ti), platinum (Pt), and gold (Au) are stacked sequentially from the substrate 11.

[Band Structure]

FIG. 3 is an energy band structure diagram on the lower side of the gate electrode 25 of the semiconductor device 1A configured as described above, and illustrates a junction state where a gate voltage Vg is not applied. It is to be noted that the energy band structure diagram illustrates a case where the lower barrier layer 13, the channel layer 14, and the upper barrier layer 15 are made, respectively, of the $Al_{0.2}Ga_{0.8}As$ mixed crystal, the $In_{0.2}Ga_{0.8}As$ mixed crystal, and the $Al_{0.2}Ga_{0.8}As$ mixed crystal.

As illustrated in FIG. 3, the semiconductor device 1A according to the present embodiment may have a configuration in which the channel layer 14 with a narrow bandgap is interposed between the lower barrier layer 13 and the upper barrier layer 15 each having a wider bandgap and higher conduction band energy Ec than those of the channel layer 14. Therefore, when electrons are supplied as the carriers from the carrier supply region 13a of the lower barrier layer 13 and the carrier supply region 15a of the upper barrier layer 15, the channel layer 14 may serve as a two-dimensional electron gas layer on which the electrons are accumulated.

Further, a discontinuous quantity ΔEc of a conduction band at a heterojunction between the channel layer 14 and the upper barrier layer 15 may be sufficiently large (0.31 eV in this case). In addition, a difference between a minimum point of the conduction band energy Ec in the upper barrier layer 15 and the conduction band energy Ec in the channel layer 14 may also be configured to be sufficiently large (0.20 eV or more in this case), and the number of electrons distributed in the upper barrier layer 15 may be negligibly smaller than the number of electrons distributed in the channel layer 14.

[Operation]

Next, description is given of the operation of the semiconductor device 1A configured as described above with reference to the energy band structure diagrams illustrated in FIGS. 4 and 5 together with FIG. 3 as well as the schematic diagram of the semiconductor device 1A of FIG. 6. In this case, description is given of the assumption that the semiconductor device 1A is a shallow depletion transistor having a threshold voltage of about −0.5 V.

FIG. 4 is an energy band structure diagram during OFF-operation (Vg=−2 V), and FIG. 5 is an energy band structure diagram during ON-operation (Vg=1 V). Further, as with FIG. 3, FIGS. 4 and 5 each illustrate a case where each of the lower barrier layer 13 and the upper barrier layer 15 is made of the $Al_{0.2}Ga_{0.8}As$ mixed crystal, and the channel layer 14 is made of the $In_{0.2}Ga_{0.8}As$ mixed crystal.

The semiconductor device 1A may be a shallow depletion type in this case. Accordingly, in a junction state (Vg=0) where no voltage is applied to the gate electrode 25, a carrier depletion region where electrons are depleted as compared with a surrounding region may be formed at a region of the channel layer 14 corresponding to a region below the p-type second low resistance region 15g. An energy band structure at this time is as illustrated in FIG. 3 as described above; the channel layer 14 may be in a high resistance state.

Here, a voltage nearly equal to the gate voltage during OFF-operation (Vg=−2 V) may be applied to the gate electrode 25 to bring the semiconductor device 1A into an OFF-operation state. It is to be noted that the voltage may be varied depending on a condition of the low resistance region; a voltage at least lower than an OFF-voltage (−2 V) (Vg<−2 V) may be applied. In this case, as illustrated in FIG. 6, a carrier depletion region A inside the channel layer 14 corresponding to a region below the p-type second low resistance region 15g may be brought into a depleted state with a further decrease in the number of carriers, and may further expand close to a region below the end E33 of the cap layer 33. This causes a drain current Id to hardly flow. An energy band structure at this time is as illustrated in FIG. 4; the conduction band energy Ec in the channel layer 14 may become completely higher than the Fermi level Ef.

In contrast, a voltage nearly equal to the gate voltage during ON-operation (Vg=1 V) may be applied to the gate electrode 25 to bring the semiconductor device 1A into an ON-operation state. In this case, the carrier depletion region A disappears, and the number of the electrons in the channel layer 14 increases to cause the drain current Id to be modulated. An energy band structure at this time is as illustrated in FIG. 5, and the conduction band energy Ec in the channel layer 14 becomes lower than the Fermi level Ef

[Manufacturing Method]

Next, description is given below of an example of a method of manufacturing the semiconductor device 1A configured as described above, with reference to the cross-sectional process diagrams of FIGS. 7A to 7D.

First, as illustrated in FIG. 7A, the buffer layer 12 may be formed by subjecting an undoped u-GaAs layer to epitaxial growth on the substrate 11 made of, for example, GaAs. Thereafter, the lower barrier layer 13 may be formed by subjecting, for example, an AlGaAs ($Al_{0.2}Ga_{0.8}As$ mixed crystal) layer to epitaxial growth on the buffer layer 12. In this case, for example, the high resistance region 13b made of an undoped u-AlGaAs layer, the carrier supply region 13a made of a silicon (Si)-doped n-type AlGaAs layer, and the high resistance region 13b' made of an undoped u-AlGaAs layer may be sequentially subjected to epitaxial growth. This may allow for the lower barrier layer 13 provided with the n-type carrier supply region 13a at the middle in the film thickness direction.

Next, the channel layer 14 may be formed by subjecting, for example, an undoped u-InGaAs layer to epitaxial growth on the lower barrier layer 13.

Thereafter, the upper barrier layer 15 may be formed by subjecting, for example, an AlGaAs ($Al_{0.2}Ga_{0.8}As$ mixed crystal) layer to epitaxial growth on the channel layer 14. In this case, the high resistance region 15b made of an undoped u-AlGaAs layer, the carrier supply region 15a made of a silicon (Si)-doped n-type AlGaAs layer, the high resistance region 15b' made of a silicon (Si)-doped n-type AlGaAs layer, and the first low resistance region R made of a carbon (C)-doped p-type AlGaAs layer may be sequentially subjected to epitaxial growth. This may allow for the upper barrier layer 15 provided with the n-type carrier supply region 15a at the middle in the film thickness direction and the first low resistance region R at the uppermost portion thereof. Subsequently, an n-type GaAs layer may be subjected to epitaxial growth as the cap layer 33 on the upper barrier layer 15.

Next, as illustrated in FIG. 7B, the cap layer 33 may be patterned. In this case, the patterning may be performed by methods such as wet etching using a photoresist as a mask. In this example, the cap layer 33 (e.g., GaAs) and the upper barrier layer 15 (e.g., AlGaAs) are made of different materials, and thus etchants with different etching rates for these materials may be used. This makes it possible to selectively remove only the cap layer 33 on the upper barrier layer 15.

However, the cap layer 33 and the upper barrier layer 15 may also be made of the same material; in this case, the cap layer 33 may be patterned as follows. That is, an etching stopper layer of a different semiconductor material may be formed between the upper barrier layer 15 and the cap layer 33 to secure etch selectivity between the etching stopper layer and the cap layer 33, thus making it possible to selectively remove only the cap layer 33. Further, it is also possible to prevent a decrease in film thickness of the upper barrier layer 15 by controlling the etching time of the cap layer 33 without using such an etching stopper layer.

Next, as illustrated in FIG. 7C, the insulating film 21 made of silicon nitride ($Si_3N_4$) may be formed on the upper barrier layer 15 by chemical vapor deposition (CVD) method, for example. Thereafter, the insulating film 21 may be subjected to pattern etching to thereby form the gate opening 21g that exposes a middle portion of the first low resistance region R. The gate opening 21g may be formed in such a size as to traverse a middle of an active region. The formation of the gate opening 21g may cause the surface of the upper barrier layer 15 to be exposed at the bottom of the gate opening 21g. In addition, more particularly, a portion on surface side of the first low resistance region R of the upper barrier layer 15 may be shaved upon opening of the gate, thus causing the first low resistance region R to have a recessed shape.

Introduction of the p-type impurities into the surface layer of the upper barrier layer 15 exposed in the gate opening 21g in this state may allow for formation of the second low resistance region 15g inside the upper barrier layer 15. In this example, zinc (Zn) as the p-type impurities may be diffused in such a depth as to exceed the depth of the first low resistance region R formed on surface side of the upper barrier layer 15 and as not to reach the carrier supply region 15a to form the second low resistance region 15g. The diffusion of zinc (Zn) may be performed, for example, by vapor-phase diffusion using a zinc compound gas at a temperature of about 600° C. This makes it possible to form the second low resistance region 15g at the bottom of the gate opening 21g in a self-alignment manner, thus allowing the first low resistance region R to be formed and extended on both sides of the second low resistance region 15g.

Following the above processes, device separation may be performed, although illustration is omitted. The device separation may be performed, for example, by forming a non-active region with increased resistance by boron ion implantation. This allows the active region "a" illustrated in FIG. 2 to be separated into an island shape.

Next, as illustrated in FIG. 7D, the gate electrode 25 may be formed on the second low resistance region 15g in such a manner as to be embedded in the gate opening 21g. In this case, the gate electrode 25 may be formed and patterned by sequential vapor deposition of titanium (Ti), platinum (Pt), and gold (Au) using a mask.

Finally, pattern etching of the insulating film 21 may form the source opening 21s and the drain opening 21d. Subsequently, the source electrode 23s and the drain electrode 23d ohmic-bonded to the cap layer 33 respectively through the source opening 21s and the drain opening 21d may be formed. In this case, patterning may be performed by sequential vapor deposition of a gold-germanium alloy (AuGe), nickel (Ni), and gold (Au). Thereafter, a heating treatment may be performed at about 400° C., for example, to form a gold-based alloy, thereby forming the source electrode 23s and the drain electrode 23d. Through the above-described processes, the semiconductor device 1A illustrated in FIG. 1 may be completed.

According to the manufacturing method described above, it is possible to form the semiconductor device 1A of the first embodiment. According to this method, the gate electrode 25 may be formed in such a state as to be embedded in the gate opening 21g after the formation of the second low resistance region 15g by means of diffusion of the p-type impurities through the gate opening 21g formed in the insulating film 21. Accordingly, it follows that the gate electrode 25 may be formed on the second low resistance region 15g in the self-alignment manner. Thus, it becomes possible to easily obtain the semiconductor device 1A of the first embodiment.

It is to be noted that formation of the gate opening 21g, the second low resistance region 15g, and the gate electrode 25 may be performed after the formation of the source opening 21s, the drain opening 21d, the source electrode 23s, and the drain electrode 23d. Even in this case, the gate electrode 25 may be formed in self-alignment with the second low resistance region 15g, thus making it possible to easily obtain the semiconductor device 1A of the first embodiment.

[Effects]

The semiconductor device 1A described above may adopt a JPHEMT structure in which the p-type second low resistance region 15g is provided on surface side of the upper barrier layer 15 adjacent to the n-type channel layer 14, with the gate electrode 25 being provided on top of the p-type second low resistance region 15g. Further, in particular, the first low resistance region R having a smaller p-type charge amount than that of the second low resistance region 15g may be provided on both sides of the second low resistance region 15g.

As illustrated in FIG. 6, the semiconductor device 1A configured in such a manner is brought into a state as described below during OFF-operation. That is, inside the channel layer 14, a depletion layer expands to a PN junction between the n-type channel layer 14 and each of the p-type second low resistance region 15g and the p-type first low resistance region R, resulting in formation of the carrier depletion region A. This causes an n-type region Sn inside the channel layer 14 to be retreated as far as the outside of the first low resistance region R.

Further, in this case, the p-type first low resistance region R is configured to have a smaller p-type charge amount than that of the second low resistance region 15g. Therefore, during the OFF-operation as described above, the first low resistance region R is depleted more easily by the PN junction with the channel layer 14, and a p-type region Sp is retreated as far as the second low resistance region 15g.

Consequently, in a configuration where the p-type first low resistance region R is provided on both sides of the p-type second low resistance region 15g, it is possible to enlarge a distance "d" from the n-type region Sn to the p-type region Sp during the OFF-operation as compared with a configuration where the p-type first low resistance region R is not provided. In other words, even when the carrier concentration of the channel layer 14 is raised to reduce the ON-resistance Ron, it is possible to reduce the OFF-capacitance Coff by the degree to which the distance "d" from the n-type region Sn to the p-type region Sp during the OFF-operation is enlarged.

It is to be noted that, in the JPHEMT structure in which the first low resistance region R is not provided, the carrier depletion region A formed in the channel layer 14 during the OFF-operation is in such a degree as to extend slightly in a lateral direction from the lower side of the second low resistance region 15g. Therefore, the distance "d" from the n-type region Sn to the p-type region Sp is shorter as compared with the configuration where the p-type first low resistance region R is provided.

Accordingly, by providing the first low resistance region R having a smaller p-type charge amount than that of the second low resistance region 15g on both sides of the second low resistance region 15g in the JPHEMT structure, it becomes possible to reduce the OFF-capacitance Coff, thus allowing the transistor characteristics to be enhanced.

Further, by arranging the cap layer 33 at each of regions on which the source electrode 23s and the drain electrode 23d are formed (regions facing the source electrode 23s and the drain electrode 23d), it becomes possible to secure a large distance from the source electrode 23s or the drain electrode 21d to the channel layer 14. This makes it possible to reduce contact resistance Rc as well as dispersion in the contact resistance. As a result, it becomes possible to reduce the ON-resistance Ron as well as dispersion in the ON-resistance Ron. Thus, it becomes possible to reduce the OFF-capacitance while reducing the ON-resistance.

FIG. 8 illustrates results of simulation for the gate voltage Vg versus the OFF-capacitance Coff performed for the semiconductor device (1) of the first embodiment and a semiconductor device (2) of a comparative example not provided with the first low resistance region R. As observed from this result, it is appreciated that, in the semiconductor device (1) of the first embodiment, the OFF-capacitance Coff during OFF-operation where the gate voltage Vg is decreased is lower, and is kept at a stable value as compared with the reference example (2).

Further, rising of the OFF-capacitance Coff near a threshold voltage is also steep. This indicates that the OFF characteristics are enhanced in the semiconductor device 1A of the first embodiment. Here, the ON-resistance Ron and the OFF-capacitance Coff are in a trade-off relationship. Thus, it is possible to enhance the ON characteristics by raising the impurity concentration of the carrier supply regions 13a and 15a by the degree to which the OFF characteristics are improved.

It is to be noted that, in the above-described first embodiment, the description has been given of a case where the semiconductor device 1A is a depletion type. However, the first embodiment may be considered similarly even when the semiconductor device 1A is an enhancement type, and the above description is applicable more appropriately.

[2. Second Embodiment]
(An Example of Providing a High Resistance Region on Top of First Low Resistance Region R)

FIG. 9 is a cross-sectional view of a configuration of a key part of a semiconductor device (semiconductor device 1B) of a second embodiment. Description is given below, with reference to the drawing, of a configuration of the semiconductor device of the second embodiment to which the technology is applied.

[Configuration]

The semiconductor device 1B of the present embodiment is different from the semiconductor device 1A of the above-described first embodiment in that a high resistance region 16 is formed on the p-type first low resistance region R. Other configurations are similar to those of the above-described first embodiment.

More specifically, in the upper barrier layer 15 of the layered body 10 in the semiconductor device 1B, the high resistance region 16 may be stacked on the first low resistance region R. The p-type second low resistance region 15g may be provided in such a depth as to reach the first low resistance region R and the high resistance region 15b' in the upper barrier layer 15 from the high resistance region 16.

The high resistance region 16 may have a thin film thickness. The high resistance region 16 may be made of a semiconductor material different from that for the first low resistance region R as long as the compound semiconductor is well lattice-matched to the first low resistance region R. Further, the high resistance region 16 either may contain impurities, or may not necessarily contain impurities. When impurities are contained, the high resistance region 16 may contain either p-type impurities or n-type impurities. As the p-type impurities to be contained in the high resistance region 16, for example, carbon (C), zinc (Zn), or magnesium (Mg) may be used. As the n-type impurities, for example, silicon (Si) may be used. These impurities may be selected as appropriate to be used depending on a method of forming the high resistance region 16.

[Manufacturing Method]

The semiconductor device 1B having the configuration as described above may operate in the same manner as the semiconductor device 1A of the above-described first embodiment. Further, for the manufacturing of the semiconductor device 1B, a layer that configures the high resistance region 16 may be formed in advance on the p-type first low resistance region R in the manufacturing procedures of the semiconductor device 1A of the above-described first embodiment.

[Effects]

The semiconductor device 1B as described above may have a configuration in which the first low resistance region R having a smaller p-type charge amount than that of the second low resistance region 15g is provided to be extended on both sides of the second low resistance region 15g, with the cap layer 33 being provided in the JPHEMT structure, thus making it possible to obtain effects similar to those of the above-described first embodiment. In addition, the formation of the high resistance region 16 on the first low resistance region R makes the first low resistance region R less likely to be influenced by an interface trap, and allows a depletion layer between the first low resistance region R and the channel layer 14 to be controlled more easily during OFF-operation. This makes it possible to surely control the retreating amount of the n-type region Sn and the p-type region Sp during OFF-operation as illustrated in FIG. 6, thus enabling a desired operation to be achieved with ease. It is to be noted that the fourth embodiment is not limited to application to the above-described first embodiment, and may be combined with the second and the third embodiments. This makes it possible to further obtain the effects of the second and the third embodiments together with the effects of the fourth embodiment.

[3. Third Embodiment]

(An Example of Providing Cap Layer 33 Only on One Side of Second Low Resistance Region 15g)

FIG. 10 is a cross-sectional view of a configuration of a key part of a semiconductor device (semiconductor device 1C) according to a third embodiment. Description is given below, with reference to the drawing, of a configuration of the semiconductor device according to the third embodiment to which the technology is applied.

[Configuration]

The semiconductor device 1C according to the present embodiment is different from the semiconductor device 1A of the above-described first embodiment in that the cap layer 33 is provided only on one side of the second low resistance region 15g. Other configurations are similar to those of the above-described first embodiment.

More specifically, in the semiconductor device 1C, the first low resistance region R and the cap layer 33 may be formed only on a region, of the second low resistance region 15g, facing either the source electrode 23s or the drain electrode 23d (in this example, the drain electrode 23d).

[Manufacturing Method]

The semiconductor device 1C having the configuration as described above may operate in the same manner as the semiconductor device 1A of the above-described first embodiment. Further, the semiconductor device 1C may be manufactured as described below, for example.

First, as illustrated in FIG. 11A, layers from the buffer layer 12 to the cap layer 33 may be formed on the substrate 11. This process may be performed in the same manner as the manufacturing procedures illustrated in the above-described first embodiment with reference to FIG. 7A.

Next, as illustrated in FIG. 11B, the cap layer 33 may be patterned and a region D11 on source side may be removed selectively to thereby expose the first low resistance region R in the region D11. Thereafter, the first low resistance region R may be patterned, and a region D12 from the gate to source side may be removed selectively. In this example, the cap layer 33 and the first low resistance region R on source side are removed; however, the cap layer 33 and the first low resistance region R on drain side may also be removed. In other words, the cap layer 33 may be formed only on side of the source electrode 23s.

Next, as illustrated in FIG. 11C, the insulating film 21 may be formed on the cap layer 33 and the upper barrier layer 15, and the gate opening 21g may be formed in the insulating film 21, in the same manner as the above-described first embodiment. Thereafter, the p-type impurities may be diffused from the gate opening 21g to thereby form the second low resistance region 15g in such a depth as to reach the high resistance region 15'.

Next, as illustrated in FIG. 11D, the gate electrode 25 in such a shape as to be embedded in the gate opening 21g may be formed on the second resistance region 15g, in the same manner as the above-described first embodiment.

Subsequently, the source opening 21s and the drain opening 21d may be formed in the insulating film 21. Thereafter, the source electrode 23s ohmic-bonded to the upper barrier layer 15 through the source opening 21s may be formed, and the drain electrode 23d ohmic-bonded to the cap layer 33 thorough the drain opening 21d may be formed. Through these processes, the semiconductor device 1C illustrated in FIG. 10 may be completed.

[Effects]

In the semiconductor device 1C as described above may have a configuration in which the first low resistance region R having a smaller p-type charge amount than that of the second low resistance region 15g is provided on one side of the second low resistance region 15g, with the cap layer 33 being provided in the JPHEMT structure. Therefore, the effects thereof are lower than those of the above-described first embodiment; however, it is possible to obtain the effect of reducing the OFF-capacitance Coff, which allows the ON-resistance Ron to be reduced accordingly. Thus, it becomes possible to obtain effects substantially equal to those of the above-described first embodiment.

Further, such a configuration of the third embodiment is advantageous to an application where a high voltage is applied only to the drain electrode 23d, for example. In this case, it is possible to shorten a distance from the source electrode 23s to the gate electrode 25 by providing the first low resistance region R to be extended only on side of the drain electrode 23d.

It is to be noted that the present third embodiment is not limited to the application to the first embodiment, and may also be combined with the second embodiment. This makes it possible to further obtain the effects of the embodiment combined, in addition to the effects of the third embodiment.

[4. Fourth Embodiment]

(an Example of Removing First Low Resistance Region R Upon Opening of a Gate)

FIG. 12 is a cross-sectional view of a configuration of a key part of a semiconductor device (semiconductor device 1D) of a fourth embodiment. Description is given below, with reference to this drawing, of a configuration of the semiconductor device according to the fourth embodiment to which the technology is applied.

[Configuration]

The semiconductor device 1D of the present embodiment is different from the semiconductor device 1A of the above-described first embodiment in that the first low resistance region R is removed upon opening of the gate (upon formation of the gate opening 21g in the insulating film 21). Other configurations are similar to those of the above-described first embodiment.

[Manufacturing Method]

The semiconductor device 1D having the configuration as described above may operate in the same manner as the semiconductor device 1A of the above-described first embodiment. Further, the semiconductor device 1D may be manufactured as described below, for example.

First, as illustrated in FIG. 13A, layers from the buffer layer 12 to the cap layer 33 may be formed on the substrate 11 in the same manner as the above-described first embodiment.

Next, as illustrated in FIG. 13B, the insulating film 21 may be so formed on the upper barrier layer 15 as to cover the cap layer 33, and thereafter the gate opening 21g may be formed. In this case, unlike the above-described first embodiment, increasing an etching amount may allow for formation of the gate opening 21g as well as complete removal of the first low resistance region R inside the gate opening 21g. It is to be noted that it is tolerable, in this case, that a portion of the high resistance region 15' on surface side may be shaved.

Consequently, as illustrated in FIG. 13C, impurity diffusion may be performed from the gate opening 21g to the surface of the upper barrier layer 15 in the same manner as the above-described first embodiment to thereby form the second low resistance region 15g.

Next, as illustrated in FIG. 13D, the gate electrode 25 in such a shape as to be embedded in the gate opening 21g may be formed on the second resistance region 15g.

Subsequently, the source opening 21s and the drain opening 21d may be formed in the insulating film 21, in the same manner as the above-described first embodiment. Thereafter, the source electrode 23s and the drain electrode 23d which are ohmic-bonded to the cap layer 33 respectively through the source opening 21s and the drain opening 21d may be formed. Through these processes, the semiconductor device 1D illustrated in FIG. 12 may be completed.

[Effects]

In the semiconductor device 1A of the above-described first embodiment, the diffusion of impurities from the gate opening 21g forms the p-type second low resistance region 15g that reaches the high resistance region 15b' from the first low resistance region R. Accordingly, the first low resistance region R and the high resistance region 15b' may be preferably made of the same material in order to control a diffusion rate; as the material, the AlGaAs mixed crystal may be preferable. In contrast, in the semiconductor device 1D, impurity diffusion is performed only for the high resistance region 15b' in the film thickness direction upon formation of the second low resistance region 15g. Accordingly, it becomes possible to freely select a material for the first low resistance region R regardless of the process of diffusion of the second low resistance region 15g (regardless of the material for the high resistance region 15 b'). For example, selection of a material excellent in interface characteristics between the first low resistance region R and the insulating film 21 makes the first low resistance region R less likely to be influenced by the interface trap, and allows the depletion layer between the first low resistance region R and the channel layer 14 to be controlled more easily during OFF-operation. This makes it possible to control the retreating amount of the n-type region Sn and the p-type region Sp during OFF-operation as illustrated in FIG. 6, thus enabling a desired operation to be achieved with ease.

It is to be noted that the present fourth embodiment is not limited to application to the above-described first embodiment, and may also be combined with one or both of the above-described second embodiment and third embodiment. This makes it possible to further obtain each of the effects of the embodiments combined, in addition to the effects of the fourth embodiment.

[5. Fifth Embodiment]

(An Example of PHEMT in Which No Second Low Resistance Region 15G is Formed)

FIG. 14 is a cross-sectional view of a configuration of a key part of a semiconductor device (semiconductor device 1E) according to a fifth embodiment. Description is given below, with reference to this drawing, of a configuration of the semiconductor device according to the fifth embodiment to which the technology is applied.

[Configuration]

The semiconductor device 1E of the present embodiment is different from the semiconductor device 1A of the above-described first embodiment in that the first low resistance region R is removed upon opening of the gate and that the p-type second low resistance region 15g is not formed. Other configurations are similar to those of the above-described first embodiment.

More specifically, in the semiconductor device 1E, the gate electrode 25 may be formed in contact with the high resistance region 15'b of the upper barrier layer 15. For example, use of titanium (Ti), platinum (Pt), and gold (Au) as the gate electrode 25 may form Schottky junction between the gate electrode 25 and the upper barrier layer 15. In the semiconductor device 1A of the above-described first embodiment, the PN junction formed between the second low resistance region 15g and the upper barrier layer 15 allows the channel to be turned ON/OFF, whereas, in the semiconductor device 1E of the present embodiment, the Schottky junction formed between the gate electrode 25 and the upper barrier layer 15 allows the channel to be turned ON/OFF.

[Operation]

Next, description is given of the operation of the semiconductor device 1E with reference to the energy band structure diagrams of FIGS. 15, 16, and 17, as well as the schematic diagram of the semiconductor device 1E of FIG. 18. Here, description is given of the operation in a case where the semiconductor device 1E is a shallow depletion transistor having a threshold voltage of about −0.5 V.

FIG. 15 is a diagram of an energy band structure on the lower side of the gate electrode 25 of the semiconductor device 1E configured as described above, in a junction state where no gate voltage Vg is applied. FIG. 16 illustrates a state during OFF-operation (Vg=−2 V), and FIG. 17 illustrates a state during ON-operation (Vg=1 V). Further, FIGS. 15, 16 and 17 illustrate a case where each of the lower barrier layer 13 and the upper barrier layer 15 is made of the $Al_{0.2}Ga_{0.8}As$ mixed crystal, and the channel layer 14 is made of the $In_{0.2}Ga_{0.8}As$ mixed crystal.

The semiconductor device 1E is a shallow depletion type in this example. Accordingly, in a junction state (Vg=0) where no voltage is applied to the gate electrode 25, a carrier depletion region where electrons are depleted as compared with a surrounding region may be formed at a region of the channel layer 14 that corresponds to a region below the gate electrode 25. An energy band structure at this time is as illustrated in FIG. 15, and the channel layer 14 is in a high resistance state.

Here, a voltage nearly equal to the gate voltage during OFF-operation (Vg=−2 V) may be applied to the gate electrode 25 to bring the semiconductor device 1E into an OFF-operation state. It is to be noted that the voltage may be varied depending on a condition of the low resistance region, and a voltage at least lower than an OFF-voltage (−2 V) (Vg<−2 V) may be applied. In this case, as illustrated in FIG. 18, the carrier depletion region A of the channel layer 14 that corresponds to a region below the gate electrode 25 may be brought into a depleted state with a further decrease in the number of carriers, and may further expand close to a region below the end of the cap layer 33. This causes the drain current Id to hardly flow. The energy band structure at this time is as illustrated in FIG. 16; the conduction band energy Ec in the channel layer 14 may become completely higher than the Fermi level Ef.

In contrast, a voltage nearly equal to the gate voltage during ON-operation (Vg=1 V) may be applied to the gate electrode 25 to bring the semiconductor device 1E into an ON-operation state. In this case, the carrier depletion region A as illustrated in FIG. 18 disappears, and the number of the electrons in the channel layer 14 increases to cause the drain current Id to be modulated. The energy band structure at this time is as illustrated in FIG. 17, and the conduction band energy Ec in the channel layer 14 becomes lower than the Fermi level Ef. It is to be noted that all of FIGS. 15 to 17 illustrate Eg (bandgap)/2 having equal magnitude.

[Manufacturing Method]

It is possible to manufacture the semiconductor device 1E by increasing an etching amount upon formation of the gate opening 21g and by omitting a process of forming the second low resistance region 15g in the procedures for manufacturing the semiconductor device 1A of the above-described first embodiment.

[Effects]

In the semiconductor device 1A of the first embodiment, the diffusion of impurities from the gate opening 21g forms the p-type second low resistance region 15g that reaches the high resistance region 15b' from the low resistance region R. Accordingly, the first low resistance region R and the high resistance region 15b' may be preferably made of the same material in order to control a diffusion rate; as the material, the AlGaAs mixed crystal may be preferable. In contrast, in the semiconductor device 1E, the second low resistance region 15g is not formed (impurity diffusion is not performed), thus making it possible to select a material for the first low resistance region R regardless of the process of diffusion. For example, selection of a material excellent in interface characteristics between the first low resistance region R and the insulating film 21 makes it possible to reduce the influence of the interface trap on device characteristics. Further, it becomes also possible to easily apply, to the semiconductor device 1E, a material such as GaN-based material which is supposed to make it difficult to introduce a process of impurity diffusion. A configuration example in the case of using the GaN-based material is described later.

It is to be noted that the present fifth embodiment is not limited to application to the above-described first embodiment, and may also be combined with one or more of the above-described second to fourth embodiments. This makes it possible to further obtain each of the effects of the embodiments combined, in addition to the effects of the fifth embodiment.

[6. Sixth Embodiment]
(Example of Multi-Gate Structure)

FIG. 19 is a cross-sectional view of a configuration of a key part of a semiconductor device (semiconductor device 2) according to a sixth embodiment. Description is given below, with reference to this drawing, of a configuration of the semiconductor device according to the sixth embodiment to which the technology is applied.

[Configuration]

The semiconductor device 2 of the present embodiment is different from the semiconductor device 1A of the above-described first embodiment in that the semiconductor device 2 has a so-called a multi-gate structure (dual gate structure) in which two gate electrodes 25 are provided between the source electrode 23s and the drain electrode 23d. Other configurations are similar to those of the above-described first embodiment. It is to be noted that it is also possible to adopt three or more gate electrodes 25 in order to obtain desired power durability, although a case is described in the following drawings and description where two gate electrodes 25 are provided between the source electrode 23s and the drain electrode 23d.

FIG. 20 illustrates a planar configuration of the semiconductor device 2 seen from the top face (from the gate electrode 25). The source electrode 23s and the drain electrode 23d may each have a comb-tooth shape, and also have a planar shape of being engaged with each other with a clearance being interposed therebetween. The two gate electrodes 25 may have a planar shape of meandering the clearance between the source electrode 23s and the drain electrode 23d.

The two gate electrodes 25 may each have a turn portion 25A along a tip of the comb-tooth portion of each of the source electrode 23s and the drain electrode 23d, and a linear portion 25B interposed between the comb teeth of the source electrode 23s and the drain electrode 23d. The turn portion 25A may preferably have a planar shape including a curve. This makes it possible to reduce electric field concentration. The curvature of the turn portion 25A is not particularly limited; it is possible to adopt a semicircular arc as illustrated in FIG. 20, for example. It is to be noted that the turn portion 25A may have a planar shape of bending rectangularly.

The layered bodies 10 may be separated from one another as a device (unillustrated in FIG. 19) on the substrate 11. More specifically, each of the layered bodies 10 may be separated as an island-shaped active region "a", and the first low resistance region R may be provided throughout the active region "a", as illustrated in FIG. 20. Further, the cap layer 33 may be provided in such a shape as to surround the source electrode 23s and the drain electrode 23d.

It is to be noted that FIG. 20 illustrates a case where both ends of the gate electrode 25 are each in a linear shape to intersect with long sides of the active region "a". However, both ends of the gate electrode 25 may bend to intersect with short sides of the active region "a". In this case, both bending ends of the gate electrode 25 either may take a planar shape including a curve similar to that of the turn portion 25A, or may take a planar shape of bending rectangularly.

[Manufacturing Method]

The semiconductor device 2 having a configuration as described above may operate in the same manner as the semiconductor device 1A of the above-described first embodiment. In other words, when a voltage at least lower than an OFF-voltage (−2 V) (Vg<−2 V) is applied, as schematically illustrated in FIG. 21, the carrier depletion region A may be formed in the channel layer 14 below the p-type second low resistance region 15g, and may be brought into a depleted state with a further decrease in the number of carriers. More specifically, in each of regions on side of the source electrode 23s and side of the drain electrode 23d, an n-type region Snl may be retreated, and the carrier depletion region A may expand close to a region below the end E33 of the cap layer 33. A distance d2 from the n-type region Sn2 located between the two gate electrodes 25 to the p-type region Sp may be determined by a relationship between the impurity concentration of the second low resistance region R and the concentration of electrons inside the channel. This causes the drain current Id to hardly flow.

Further, it is possible for the semiconductor device 2 to be manufactured by adopting a top face layout in which the two gate electrodes 25 are disposed between the source electrode 23s and the drain electrode 23d in the procedures for manufacturing the semiconductor device 1A of the above-described first embodiment.

[Effects]

The semiconductor device 2 as described above may have a configuration in which the first low resistance region R having a smaller p-type charge amount than that of the second low resistance region 15g is provided to be extended on both sides of the second low resistance region 15g, with the cap layer 33 being provided in the JPHEMT structure, thus making it possible to obtain effects similar to those of the above-described first embodiment. In addition, by adopting the multi-gate structure having the two gate electrodes 25 between the source electrode 23s and the drain electrode 23d, it becomes possible to reduce a chip size, as compared to a case where a plurality of semiconductor devices 1A of the above-described first embodiment are coupled in series.

It is to be noted that the present sixth embodiment is not limited to application to the above-described first embodiment, and may also be combined with one or more of the above-described second to fifth embodiments. This makes it possible to further obtain each of the effects of the embodiments combined, in addition to the effects of the sixth embodiment.

[7. Modification Example 1]

In the above-described first to sixth embodiments, the layers in the layered body 10 made of a compound semiconductor to be formed on top of the substrate 11 are assumed to be lattice-matched to each other. However, the technology is not limited to such a configuration; the layered body 10 made of a compound semiconductor to be formed on top of the substrate 11 may also be made of a compound semiconductor layer grown by a pseudo-morphic technique or a compound semiconductor layer having a different lattice constant grown by a metamorphic technique. For example, a compound semiconductor having different lattice constant from that of GaAs may be subjected to metamorphic growth on the substrate 11 made of GaAs to be used as the channel layer 14.

[8. Modification Example 2]

Further, in the above-described first to sixth embodiments, the description has been given of the semiconductor devices 1A to 1E and 2 each having a so-called JPHEMT structure in which the channel layer 14 and the second low resistance region 15g of a reverse electrically conductive type are provided inside the upper barrier layer 15. However, other configurations may also be adopted as long as it is possible to modulate a band of the first low resistance region R. For example, the technology is not limited to such a JPHEMT structure, and may also be applicable to a semiconductor device having any of other configurations, such as a junction FET (JFET) using an impurity layer as a channel and a metal-insulator-semiconductor JPHEMT (MIS-JPHEMT) forming an insulating film between an upper barrier layer and a gate electrode.

FIG. 22 illustrates a cross-sectional configuration of a key part of a semiconductor device (semiconductor device 3) having a JFET structure. The semiconductor device 3 may include the layered body 10 including the channel layer 14 made of a compound semiconductor, and the gate electrode 25 provided on top surface side of the layered body 10.

More specifically, in the semiconductor device 3, the buffer layer 12 and the channel layer 14 made of respective compound semiconductor materials may be stacked in this order on the substrate 11 made of a compound semiconductor. The buffer layer 12 and the channel layer 14 may configure the layered body 10. In the same manner as the above-described first embodiment, each of the source electrode 23s and the drain electrode 23d, and the gate electrode 25 may be provided on the layered body 10, with the insulating film 21 being interposed therebetween.

Further, in the semiconductor device 3, the layered body 10 may include the second low resistance region 15g provided on top surface side of the layered body 10 to face the gate electrode 25, and the first low resistance region R provided outside the second low resistance region 15g in such a manner as to be continuous to the second low resistance region 15g. This makes it possible to reduce the OFF-capacitance in the semiconductor device 3. Further, it is possible to reduce the ON-resistance in the same manner as the above-described first embodiment, owning to the configuration in which the cap layer 33 is provided between the first low resistance region R and each of the source electrode 23s and the drain electrode 23d.

The channel layer 14 may be, for example, an n-type impurity region, and each of the second low resistance region 15g and the first low resistance region R may be, for example, a p-type impurity region. It is to be noted that an electrically conductive type of the channel layer 14 may be reverse to an electrically conductive type of each of the second low resistance region 15g and the first low resistance region R.

FIG. 23 illustrates a cross-sectional configuration of a key part of a semiconductor device (semiconductor device 4) having an MISPHEMT structure. The semiconductor device 4 may include the layered body 10 including the channel layer 14 made of a compound semiconductor, and the gate electrode 25 provided on top surface side of the layered body 10.

More specifically, in the semiconductor device 4, the buffer layer 12, the lower barrier layer 13, the channel layer 14, and the upper barrier layer 15 made of respective compound semiconductor materials may be stacked in this order on the substrate 11 made of a compound semiconductor. The buffer layer 12, the lower barrier layer 13, the channel layer 14, and the upper barrier layer 15 may configure the layered body 10. In the same manner as the above-described first embodiment, each of the source electrode 23s and the drain electrode 23d and the gate electrode 25 may be provided on the layered body 10, with the insulating film 21 being interposed therebetween. However, in the present modification example, a gate insulating film 26 may be provided between the upper barrier layer 15 and the gate electrode 25.

Further, in the semiconductor device 4, the layered body 10 may include the first low resistance region R provided on top surface side of the layered body 10 to face the gate electrode 25. This makes it possible to reduce the OFF-capacitance in the semiconductor device 4. Further, it is possible to reduce the ON-resistance in the same manner as the above-described first embodiment, owning to the configuration in which the cap layer 33 is provided between the first low resistance region R and each of the source electrode 23s and the drain electrode 23d.

It is to be noted that FIGS. 22 and 23 each illustrate a case where a single gate electrode 25 is provided between the source electrode 23s and the drain electrode 23d. However, as with the sixth embodiment, the present modification example is also applicable to a multi-gate structure in which two or more gate electrodes 25 are provided between the source electrode 23s and the drain electrode 23d.

[9. Modification Example 3]

In the above-described semiconductor device 2 of the sixth embodiment, device parameters (Lgs, Lgd, and Lgg) at the turn portion 25A either may be the same as or may be different from device parameters at the linear portion 25B. FIG. 24 illustrates an enlarged view of the turn portion 25A in the case where the device parameters are the same, and FIG. 25 illustrates an enlarged view of the turn portion 25A in the case where the device parameters are different. In FIG. 25, it is also possible to make device parameters LgsA, LgdA, and LggA at the turn portion 25A wider than device parameters LgsB, LgdB, and LggB at the linear portion 25B. The turn portion 25A has an influence on the OFF-capacitance Coff, while having less influence on the ON-resistance Ron. Therefore, by making the device parameters LgsA, LgdA, and LggA at the turn portion 25A wider than the device parameters LgsB, LgdB, and LggB at the linear portion 25B, it becomes possible to reduce the OFF-capacitance Coff, as well as to reduce the ON-resistance Ron and the OFF-capacitance Coff. It is to be noted that FIGS. 24 and 25 each illustrate a case where three gate electrodes 25 are provided between the source electrode 23s and the drain electrode 23d.

[10. Modification Example 4]

In each of the above-described first to sixth embodiments and modification examples 1 to 3, it is assumed that an FET having InGaAs as the channel layer 14 may be formed on the GaAs substrate or on the InP substrate. However, the technology is not limited to such a configuration, and may also be applicable to a different material-based device. For example, the substrate 11 may be made of GaN, silicon, or sapphire, and a two-dimensional electron gas layer made of GaN or AlGaN may be used as the channel layer 14 on the substrate 11.

[11. Application Example]

[Antenna Switch Circuit and Wireless Communication Apparatus]

The semiconductor device described in each of the embodiments and the modification examples as described above may be used, for example, for a wireless communication apparatus in a mobile communication system, and may be particularly used as an antenna switch for such an apparatus. The semiconductor device is particularly effective for such a wireless communication apparatus with a communication frequency of an ultra-high frequency (UHF) band or higher.

More specifically, use of any of the semiconductor devices described in the first to the fifth embodiments having low OFF-capacitance Coff and excellent harmonic distortion characteristics for the antenna switch in the wireless communication apparatus makes it possible to achieve a wireless communication apparatus having a smaller size and lower power consumption. In particular, in a mobile communication terminal, prolonged operating time owing to the smaller size and lower power consumption of the apparatus makes it possible to achieve improved portability.

FIG. 26 illustrates an example of an antenna switch circuit (antenna switch circuit 5A). The antenna switch circuit 5A, that is used for a mobile communication system such as a mobile phone, may have, for example, a first terminal IN, a second terminal IO, a third terminal OUT, a first switching device SW1, and a second switching device SW2.

The first terminal IN may receive a transmission signal. The second terminal 10 may be coupled to an antenna. The third terminal OUT may output a reception signal received by the antenna. The first switching device SW1 may be coupled between the first terminal IN and the second terminal 10. The second switching device SW2 may be coupled between the second terminal 10 and the third terminal OUT. One or both of the first switching device SW1 and the second switching device SW2 are configured by any of the semiconductor devices 1A to 1E according, respectively, to the first to the fifth embodiments.

A third switching device SW3 may be coupled between the first terminal IN and a power supply (a ground in this example). A fourth switching device SW4 may be coupled between the third terminal OUT and the power supply (the ground in this example). One or both of the third switching device SW3 and the fourth switching device SW4 are configured by any of the semiconductor devices 1A to 1E according, respectively, to the first to the fifth embodiments.

In the antenna switch circuit 5A, during signal transmission, i.e., when a transmission signal is outputted from a transmission system of the wireless communication apparatus to the antenna, the first switching device SW1 and the fourth switching device SW4 may be brought into an electrically conductive state, and the second switching device SW2 and the third switching device SW3 may be brought into an electrically non-conductive state. At this time, a transmission signal may be inputted from the first terminal IN, and may be outputted to the second terminal IO via the first switching device SW1.

During signal reception, i.e., when a signal received by the antenna is inputted to a reception system of the wireless communication apparatus, the first switching device SW1 and the fourth switching device SW4 may be brought into the electrically non-conductive state, and the second switching device SW2 and the third switching device SW3 may be brought into the electrically conductive state. At this time, a reception signal received by the antenna may be inputted from the second terminal IO, and may be outputted to the third terminal OUT via the second switching device SW2.

FIG. 27 illustrates another example of the antenna switch circuit (antenna switch circuit 5B). In the antenna switch circuit 5B, one or more of the first to the fourth switching devices SW1 to SW4 are configured, for example, by any of the semiconductor devices 1A to 1E according, respectively, to the first to the fifth embodiments being multi-stage coupled (e.g., two-stage coupled in FIG. 27). This makes it possible to enhance power durability in the antenna switch circuit 5B.

More specifically, the first switching device SW1 may have a configuration in which a plurality of any of the semiconductor devices 1A to 1E each having a single gate electrode 25 between the source electrode 23s and the drain electrode 23d are coupled in series. The first switching device SW1 may have a stack structure in which the source electrode 23s, the gate electrode 25, the drain electrode 23d, the source electrode 23s, the gate electrode 25, and the drain electrode 23d are arranged in this order. The same applies to the second to the fourth switching devices SW2 to SW4.

FIG. 28 illustrates yet another example of the antenna switch circuit (antenna switch circuit 5C). In the antenna switch circuit 5C, one or more of the first to the fourth switching devices SW1 to SW4 are configured by the semiconductor device 2 according to the sixth embodiment. This makes it possible to enhance power durability in the antenna switch circuit 5C.

FIG. 29 illustrates yet another example of the antenna switch circuit (antenna switch circuit 5D). In this antenna switch circuit 5D, each of the first to the fourth switching devices SW1 to SW4 are configured, for example, by the semiconductor device 2 according to the sixth embodiment being multi-stage coupled (e.g., two-stage coupled in FIG. 29). This makes it possible to further enhance power durability in the antenna switch circuit 5D.

More specifically, the first switching device SW1 may have a configuration in which a plurality of semiconductor device 2 of the multi-gate structure having two or more gate electrodes 25 between the source electrode 23s and the drain electrode 23d are coupled in series. The first switching device SW1 may have a stack structure, for example, in which the source electrode 23s, the gate electrode 25, the gate electrode 25, the drain electrode 23d, the source electrode 23s, the gate electrode 25, the gate electrode 25, and the drain electrode 23d are arranged in this order. The same applies to the second to the fourth switching devices SW2 to SW4.

FIG. 30 illustrates an example of the wireless communication apparatus (wireless communication apparatus 6). The wireless communication apparatus 6 may be a mobile phone system having multiple functions including, for example, voice and data communication and LAN connection. The wireless communication apparatus 6 may include, for example, an antenna ANT, an antenna switch circuit 5, a high-power amplifier HPA, a high-frequency integrated circuit RFIC (Radio Frequency Integrated Circuit), a baseband section BB, a voice output section MIC, a data output section DT, and an interface section I/F (e.g., wireless LAN (W-LAN: Wireless Local Area Network), Bluetooth (registered trademark), etc.). The antenna switch circuit 5 is configured by any of the antenna switch circuits 5A to 5D illustrated, respectively, in FIG. 26 to FIG. 29. The high-frequency integrated circuit RFIC and the baseband section BB may be coupled to each other via the interface section I/F.

In the wireless communication apparatus 6, during signal transmission, i.e., when a transmission signal is outputted from a transmission system of the wireless communication apparatus 6 to the antenna ANT, a transmission signal outputted from the baseband section BB may be outputted to the antenna ANT via the high-frequency integrated circuit RFIC, the high-power amplifier HPA, and the antenna switch circuit 5.

During signal reception, i.e., when a signal received by the antenna ANT is inputted to a reception system of the wireless communication apparatus, a reception signal may be inputted to the baseband section BB via the antenna switch circuit 5 and the high-frequency integrated circuit RFIC. The signal processed in the baseband section BB may be outputted from the output sections such as the voice output section MIC, the data output section DT, and the interface section I/F.

The technology has been described heretofore with reference to some embodiments and modification examples. However, the technology is not limited to the foregoing embodiments, modification examples, and application examples, and various modifications may be made. For example, in the foregoing embodiments, modification examples, and application examples, the description has been given specifically of the configurations of the semiconductor devices 1A to 1E and 2 to 4, the antenna switch circuits 5A to 5D, and the wireless communication apparatus 6. However, the semiconductor devices 1A to 1E and 2 to 4, the antenna switch circuits 5A to 5D, and the wireless communication apparatus 6 are not limited to those that include all of the components illustrated in the drawings. Further, some components may be replaced with any other components.

Further, materials and thicknesses of respective layers, or film-forming methods and film-forming conditions, for example, described in the foregoing embodiments, modification examples, and application examples are not limited. Other materials and thicknesses may be used, or other film-forming methods and film-forming conditions may also be adopted. It is to be noted that the effects described in the foregoing embodiments, modification examples, and application examples are mere examples, and the effects of the disclosure may be other different effects, or may further include other effects.

It is to be noted that the technology may also have the following configurations.

(1)

A semiconductor device including:

a layered body including a channel layer made of a compound semiconductor, and a first low resistance region provided in a portion on surface side of the layered body;

a gate electrode, a source electrode, and a drain electrode each being provided on top surface side of the layered body; and a cap layer provided between the first low resistance region and one or both of the source electrode and the drain electrode.

(2)

The semiconductor device according to (1), wherein the layered body further includes a second low resistance region provided to face the gate electrode and to be continuous to the first low resistance region.

(3)

The semiconductor device according to (2), wherein the source electrode and the drain electrode are provided to interpose the gate electrode in a plan view on the top surface side of the layered body, and the first low resistance region is provided to extend from an end of the second low resistance region to a region facing one or both of the source electrode and the drain electrode.

(4)

The semiconductor device according to (2) or (3), wherein the first low resistance region and the second low resistance region each contain an impurity of a second electrically conductive type reverse to a first electrically conductive type of a carrier traveling in the channel layer, and the first low resistance region has a smaller charge amount of the second electrically conductive type than the second low resistance region.

(5)

The semiconductor device according to (4), wherein the first low resistance region has a lower impurity concentration of the second electrically conductive type than the second low resistance region.

(6)

The semiconductor device according to (4), wherein the first low resistance region has a thickness smaller than a thickness of the second low resistance region.

(7)

The semiconductor device according to any one of (1) to (6), wherein the cap layer contains an impurity of a first electrically conductive type that is same as a first electrically conductive type of a carrier traveling in the channel layer, and a charge amount of the first electrically conductive type of the cap layer is larger than a charge amount of a second electrically conductive type of the first low resistance region.

(8)

The semiconductor device according to any one of (1) to (7), wherein the layered body includes the channel layer and an upper barrier layer on top of the channel layer in this order, and the upper barrier layer is made of a compound semiconductor in which an energy band on carrier-traveling side at a junction with the channel layer is more distant from an intrinsic Fermi level within the channel layer than the channel layer.

(9)

The semiconductor device according to (8), wherein the layered body further includes a lower barrier layer provided below the channel layer, the lower barrier layer being made of the compound semiconductor in which the energy band on the carrier-traveling side at the junction with the channel layer is more distant from the intrinsic Fermi level within the channel layer than the channel layer.

(10)

The semiconductor device according to (9), wherein the channel layer is made of an InGaAs mixed crystal that is a group III-V compound semiconductor, and the barrier layer is made of an In(AlGa)AsP mixed crystal that is a group III-V compound semiconductor.

(11)

The semiconductor device according to any one of (1) to (10), wherein the gate electrode includes two or more gate electrodes that are provided between the source electrode and the drain electrode.

(12)

The semiconductor device according to (11), wherein the source electrode and the drain electrode each have a comb-tooth shape, and have a planar shape of being engaged with each other with a clearance being interposed therebetween, and the two or more gate electrodes have a planar shape of meandering the clearance.

(13)

The semiconductor device according to any one of (1) to (12), wherein the layered body further includes a high resistance region provided on the first low resistance region.

(14)

The semiconductor device according to any one of (1) to (13), wherein, in an OFF state where a voltage is applied to the gate electrode, a carrier inside the channel layer below the first low resistance region and a charge inside the first low resistance region of an electrically conductive type reverse to an electrically conductive type of the carrier are both depleted.

(15)

The semiconductor device according to any one of (1) to (14), wherein the channel layer is provided on a substrate made of GaAs.

(16)

The semiconductor device according to any one of (1) to (14), wherein the channel layer is provided on a substrate made of GaN.

(17)

An antenna switch circuit including:

a first terminal that receives a transmission signal;

a second terminal coupled to an antenna;

a third terminal that outputs a reception signal received by the antenna;

a first switching device coupled between the first terminal and the second terminal; and a second switching device coupled between the second terminal and the third terminal, wherein the first switching device is brought into an electrically conductive state and the second switching device is brought into an electrically non-conductive state during signal transmission, and the first switching device is brought into the electrically non-conductive state and the second switching device is brought into the electrically conductive state during signal reception, and one or both of the first switching device and the second switching device include a layered body including a channel layer made of a compound semiconductor, and a first low resistance region provided in a portion on surface side of the layered body, a gate electrode, a source electrode, and a drain electrode each being provided on top surface side of the layered body, and a cap layer provided between the first low resistance region and one or both of the source electrode and the drain electrode.

(18)

The antenna switch circuit according to (17), wherein one or both of the first switching device and the second switching device have a multi-gate structure.

(19)

The antenna switch circuit according to (17) or (18), wherein one or both of the first switching device and the second switching device are configured by a plurality of switching devices that are multi-stage coupled.

(20)

A wireless communication apparatus provided with an antenna and an antenna switch circuit that performs switching between an input of a transmission signal to the antenna and an output of a reception signal received by the antenna, the antenna switch circuit including:

a first terminal that receives a transmission signal;

a second terminal coupled to an antenna;

a third terminal that outputs a reception signal received by the antenna;

a first switching device coupled between the first terminal and the second terminal; and a second switching device coupled between the second terminal and the third terminal, wherein the first switching device is brought into an electrically conductive state and the second switching device is brought into an electrically non-conductive state during signal transmission, and the first switching device is brought into the electrically non-conductive state and the second switching device is brought into the electrically conductive state during signal reception, and one or both of the first switching device and the second switching device include a layered body including a channel layer made of a compound semiconductor, and a first low resistance region provided in a portion on surface side of the layered body, a gate electrode, a source electrode, and a drain electrode each being provided on top surface side of the layered body, and a cap layer provided between the first low resistance region and one or both of the source electrode and the drain electrode.

This application is based upon and claims the benefit of priority of the Japanese Patent Application No. 2014-224156 filed with the Japan Patent Office on Nov. 4, 2014, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. A semiconductor device comprising:
a compound semiconductor upper barrier layer between an insulating film and a compound semiconductor channel layer; and
a compound semiconductor first cap layer between a first electrode and a first low resistance region of the upper barrier layer,
wherein the first electrode extends through the insulating film to the first cap layer, and
wherein the first cap layer is in direct physical contact with the first low resistance region, the first cap layer is of a first electrically conductive type and the first low resistance region is of a second electrically conductive type.

2. The semiconductor device according to claim 1, wherein the upper barrier layer is of the first electrically conductive type.

3. The semiconductor device according to claim 1, wherein the channel layer is undoped.

4. The semiconductor device according to claim 1, wherein the second electrically conductive type is opposite to the first electrically conductive type.

5. The semiconductor device according to claim 1, wherein the first electrically conductive type is N-type.

6. The semiconductor device according to claim 1, wherein the second electrically conductive type is P-type.

7. The semiconductor device according to claim 1, wherein a charge amount of the first electrically conductive type of the cap layer is larger than a charge amount of a second electrically conductive type of the first low resistance region.

8. The semiconductor device according to claim 1, further comprising:
a gate electrode that extends through the insulating film to a second low resistance region of the upper barrier layer.

9. The semiconductor device according to claim 8, wherein the second low resistance region is of the first electrically conductive type.

10. The semiconductor device according to claim 8, wherein the second low resistance region is of the second electrically conductive type.

11. The semiconductor device according to claim 1, further comprising:
a compound semiconductor second cap layer between a second electrode and a second low resistance region of the upper barrier layer.

12. The semiconductor device according to claim 11, wherein the second electrode extends though the insulating film to the second cap layer, the second cap layer is of the first electrically conductive type and the second low resistance region is of the second electrically conductive type.

13. An antenna switch circuit comprising:
the semiconductor device according to claim 1; and
a terminal coupled to the antenna switch circuit.

14. A wireless communication apparatus comprising:
the antenna switch circuit according to claim 13; and
an antenna coupled to the antenna switch circuit.

* * * * *